(12) United States Patent
Naito

(10) Patent No.: US 10,319,808 B2
(45) Date of Patent: Jun. 11, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/910,028

(22) Filed: Mar. 2, 2018

(65) Prior Publication Data

US 2018/0286943 A1 Oct. 4, 2018

(30) Foreign Application Priority Data

Apr. 3, 2017 (JP) .................. 2017-074010
Aug. 9, 2017 (JP) .................. 2017-154218

(51) Int. Cl.
*H01L 29/06* (2006.01)
*H01L 29/40* (2006.01)
(Continued)

(52) U.S. Cl.
CPC ...... *H01L 29/0619* (2013.01); *H01L 29/0653* (2013.01); *H01L 29/0696* (2013.01);
(Continued)

(58) Field of Classification Search
CPC ............ H01L 29/0619; H01L 29/0696; H01L 29/66348; H01L 29/7397; H01L 29/08; H01L 29/0653; H01L 29/42376; H01L 29/4236; H01L 29/407; H01L 29/0623; H01L 29/105
See application file for complete search history.

(56) References Cited

U.S. PATENT DOCUMENTS 8,058,670 B2 * 11/2011 Hshieh ............... H01L 29/0619
257/136
2012/0146091 A1 6/2012 Tanabe et al.
(Continued)

FOREIGN PATENT DOCUMENTS

JP 2008205500 A 9/2008
JP 2011165971 A 8/2011
(Continued)

*Primary Examiner* — Yosef Gebreyesus

(57) ABSTRACT

A semiconductor device is provided, including a semiconductor substrate; a first conductivity type drift region provided inside the semiconductor substrate; a plurality of gate trench portions provided extending from an upper surface of the semiconductor substrate and reaching the drift region; a dummy trench portion provided between two gate trench portions and provided extending from the upper surface of the semiconductor substrate and reaching the drift region; a second conductivity type base region provided: in a region of the semiconductor substrate adjacent to any of the gate trench portions; and between the upper surface of the semiconductor substrate and the drift region; and a second conductivity type first well region provided: in a region of the semiconductor substrate adjacent to the dummy trench portion; and reaching a position deeper than a lower end of the dummy trench portion; and having a doping concentration higher than that of the base region.

24 Claims, 33 Drawing Sheets

(51) Int. Cl.
*H01L 29/423* (2006.01)
*H01L 29/08* (2006.01)
*H01L 29/739* (2006.01)
*H01L 29/66* (2006.01)
*H01L 29/10* (2006.01)

(52) U.S. Cl.
CPC ............ *H01L 29/08* (2013.01); *H01L 29/407* (2013.01); *H01L 29/4236* (2013.01); *H01L 29/42376* (2013.01); *H01L 29/66348* (2013.01); *H01L 29/7397* (2013.01); *H01L 29/0623* (2013.01); *H01L 29/105* (2013.01)

(56) References Cited

U.S. PATENT DOCUMENTS

| | | | |
|---|---|---|---|
| 2013/0037853 A1* | 2/2013 | Onozawa | H01L 29/0661 257/139 |
| 2013/0256744 A1* | 10/2013 | Tang | H01L 29/7397 257/139 |
| 2014/0077256 A1* | 3/2014 | Hikasa | H01L 29/66348 257/139 |
| 2015/0091055 A1 | 4/2015 | Gejo et al. | |

FOREIGN PATENT DOCUMENTS

| | | |
|---|---|---|
| JP | 2014197702 A | 10/2014 |
| JP | 2015072950 A | 4/2015 |

\* cited by examiner

FIG. 10

SEMICONDUCTOR DEVICE

The contents of the following Japanese patent application(s) are incorporated herein by reference:
NO. 2017-074010 filed on Apr. 3, 2017, and
NO. 2017-154218 filed on Aug. 9, 2017.

BACKGROUND

1. Technical Field

The present invention relates to a semiconductor device.

2. Related Art

Conventionally, a power semiconductor element such as an insulated gate bipolar transistor (IGBT) has been known (please see Patent Document 1, for example). In a semiconductor element such as an IGBT, the ON voltage can be lowered by accumulating carriers such as holes in a drift region.

Patent Document 1: Japanese Patent Application Publication No. 2015-72950

If extraction of carriers for example at the time of turn-off of a semiconductor device is insufficient for the concentration of carriers accumulated in a drift region, the withstand capability of the semiconductor device lowers.

SUMMARY

A first aspect of the present invention provides a semiconductor device having a semiconductor substrate.

The semiconductor device may include a first conductivity type drift region provided inside the semiconductor substrate. The semiconductor device may include a plurality of gate trench portions provided to extend from an upper surface of the semiconductor substrate and to reach the drift region. The semiconductor device may include a dummy trench portion provided between two gate trench portions and provided to extend from the upper surface of the semiconductor substrate and to reach the drift region. The semiconductor device may include a second conductivity type base region that is provided: in a region of the semiconductor substrate adjacent to any of the gate trench portions; and between the upper surface of the semiconductor substrate and the drift region. The semiconductor device may include a second conductivity type first well region that: is provided: in a region of the semiconductor substrate adjacent to the dummy trench portion; and to reach a position deeper than a lower end of the dummy trench portion; and has a doping concentration higher than that of the base region.

Two or more dummy trench portions may be provided between the two gate trench portions. Inside the semiconductor substrate, a dummy mesa portion may be formed between the two dummy trench portions. The dummy mesa portion may be provided with the first well region. The first well region may be provided in contact with both of the two dummy trench portions.

The first well region may cover at least part of a bottom portion of the dummy trench portion. The dummy trench portion may have a first dummy side wall to which the first well region is adjacent. At a bottom portion of the dummy trench portion, the first well region may cover at least part of a region between a center of the bottom portion in a width direction and the first dummy side wall. The dummy trench portion may have a second dummy side wall opposite to the first dummy side wall. The first well region may cover a bottom portion of the dummy trench portion to reach the second dummy side wall side past a center of the bottom portion of the dummy trench portion in the width direction.

The dummy trench portion and the gate trench portions may be formed to reach the same depth. The dummy trench portion may be formed deeper than the gate trench portions.

The semiconductor device may include a second conductivity type collector region provided between a lower surface of the semiconductor substrate and the drift region. The semiconductor device may include a first conductivity type lower-surface side region provided in at least a partial region below the dummy mesa portion and at the same depth position as the collector region.

The dummy trench portion may have a longer side and a shorter side at the upper surface of the semiconductor substrate. Below the dummy mesa portion, the collector regions and the lower-surface side regions may be arranged alternately along a longer side direction of the dummy trench portion.

In a region that is inside the semiconductor substrate and is adjacent to the gate trench portions, an accumulation region having a doping concentration higher than that of the drift region may be provided. A first conductivity type doping concentration of a region that is inside the semiconductor substrate, is adjacent to the dummy trench portion, and is at the same depth position as the accumulation region may be lower than that of the accumulation region.

In a mesa portion sandwiched by two trench portions at least one of which is one of the gate trench portions, an accumulation region having a doping concentration higher than that of the drift region may be provided continuously to extend from a position contacting one of the trench portions and to reach a position contacting the other of the trench portions. The dummy mesa portion may not be provided with the accumulation region.

In a mesa portion sandwiched by one of the gate trench portions and the dummy trench portion that are adjacent to each other, the accumulation region may be provided in contact with the gate trench portion. The accumulation region may be provided not in contact with the dummy trench portion.

The gate trench portions may have longer sides and shorter sides at the upper surface of the semiconductor substrate. The gate trench portions may have first gate side walls that are inside the semiconductor substrate and are along a longer side direction of the gate trench portions, and second gate side walls opposite to the first gate side walls. Inside the semiconductor substrate, first mesa portions adjacent to the first gate side walls of the gate trench portion and second mesa portions adjacent to the second gate side walls of the gate trench portions may be provided. First conductivity type emitter regions and second conductivity type contact regions may be arranged at upper surfaces of the first mesa portions and the second mesa portions such that they are exposed alternately along the longer side direction of the gate trench portions. At least a partial region of at least one of the emitter regions in the first mesa portions may be arranged at a position facing one of the contact regions in the second mesa portions.

The semiconductor device may further include a first conductivity type emitter region provided to an upper surface of the semiconductor substrate adjacent to the gate trench portion. A contact width of a contact formed on the first well region may be greater than a contact width of a contact formed on the emitter region.

A mesa width of a mesa portion between the dummy trench portions may be greater than a mesa width of a mesa portion sandwiched by two trench portions at least one of which is one of the gate trench portions.

The dummy mesa portion may be provided with an accumulation region having a doping concentration higher than that of the drift region.

A film thickness of a dummy insulating film of the dummy trench portion may be greater than a film thickness of gate insulating films of the gate trench portions.

A second aspect of the present invention provides a semiconductor device having a semiconductor substrate.

A semiconductor device may include a gate trench portion that: is provided to extend from an upper surface of the semiconductor substrate into the semiconductor substrate; has a longer side and a shorter side on the upper surface of the semiconductor substrate; and has a first gate side wall and a second gate side wall opposite to the first gate side wall. The first gate side wall may be provided inside the semiconductor substrate and along a longer side direction. The second gate side wall may be a second gate side wall opposite to the first gate side wall. The semiconductor device may include a first mesa portion that is inside the semiconductor substrate and is adjacent to the first gate side wall of the gate trench portion. The semiconductor device may include a second mesa portion that is inside the semiconductor substrate and is adjacent to the second gate side wall of the gate trench portion. First conductivity type emitter regions and second conductivity type contact regions may be arranged at respective upper surfaces of the first mesa portion and the second mesa portion such that they are exposed alternately along the longer side direction of the gate trench portion. At least a partial region of at least one of the emitter regions in the first mesa portions may be arranged at a position facing one of the contact regions in the second mesa portions.

At least a partial region of at least one of the contact regions in the first mesa portions may be arranged at a position facing one of the emitter regions in the second mesa portions. In the first mesa portion, the emitter regions may be formed longer in the longer side direction of the gate trench portion than the contact regions are. In the first mesa portion, the contact regions may be formed longer in the longer side direction of the gate trench portion than the emitter regions are.

In the first mesa portion the emitter regions and the contact regions may have the same length in the longer side direction of the gate trench portion. In the first mesa portion, a trench portion extending in the shorter side direction of the gate trench portion may not be formed in a region where the emitter regions or the contact regions are formed.

The summary clause does not necessarily describe all necessary features of the embodiments of the present invention. The present invention may also be a sub-combination of the features described above.

BRIEF DESCRIPTION OF THE DRAWINGS

FIG. 10 is a figure showing another example of the cross-section taken along the line a-a in FIG. 3.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one of the directions parallel with the depth direction of a semiconductor substrate is referred to as the "upward" direction and the other direction is referred to as the "downward" direction. Among the two principal surfaces of a substrate, layer or another member, one of the surfaces is referred to as the upper surface and the other surface is referred to as the lower surface. The "upward" and "downward" directions are not limited by the direction of gravity or the direction of attachment to a substrate or the like at the time of implementation of a semiconductor device. In the present specification, technical matters are explained in some cases using orthogonal coordinate axes which are an X-axis, a Y-axis and a Z-axis. The depth direction of a semiconductor substrate is defined as the Z-axis. Also, the orthogonal coordinate system is a so-called right-handed system in the present example.

Although in the present specification, the terms "emitter" and "collector" are used, semiconductor devices are not limited to IGBTs. The "source" and "drain" in a transistor such as a MOSFET may be also included in the scope of the terms "emitter" and "collector" in the present specification.

Although in each example shown, the first conductivity type is N-type, and the second conductivity type is P-type, the first conductivity type may be P-type, and the second conductivity type may be N-type. In this case, conductivities of substrates, layers, regions and the like in each example become opposite polarities, respectively. In the present specification, if doping concentrations are compared between regions, peak concentrations of the respective regions may be used.

If in the present specification, being "the same" means that there may be errors due to variation in manufacturing or the like. The errors are 10% or smaller, for example.

Figure 1:
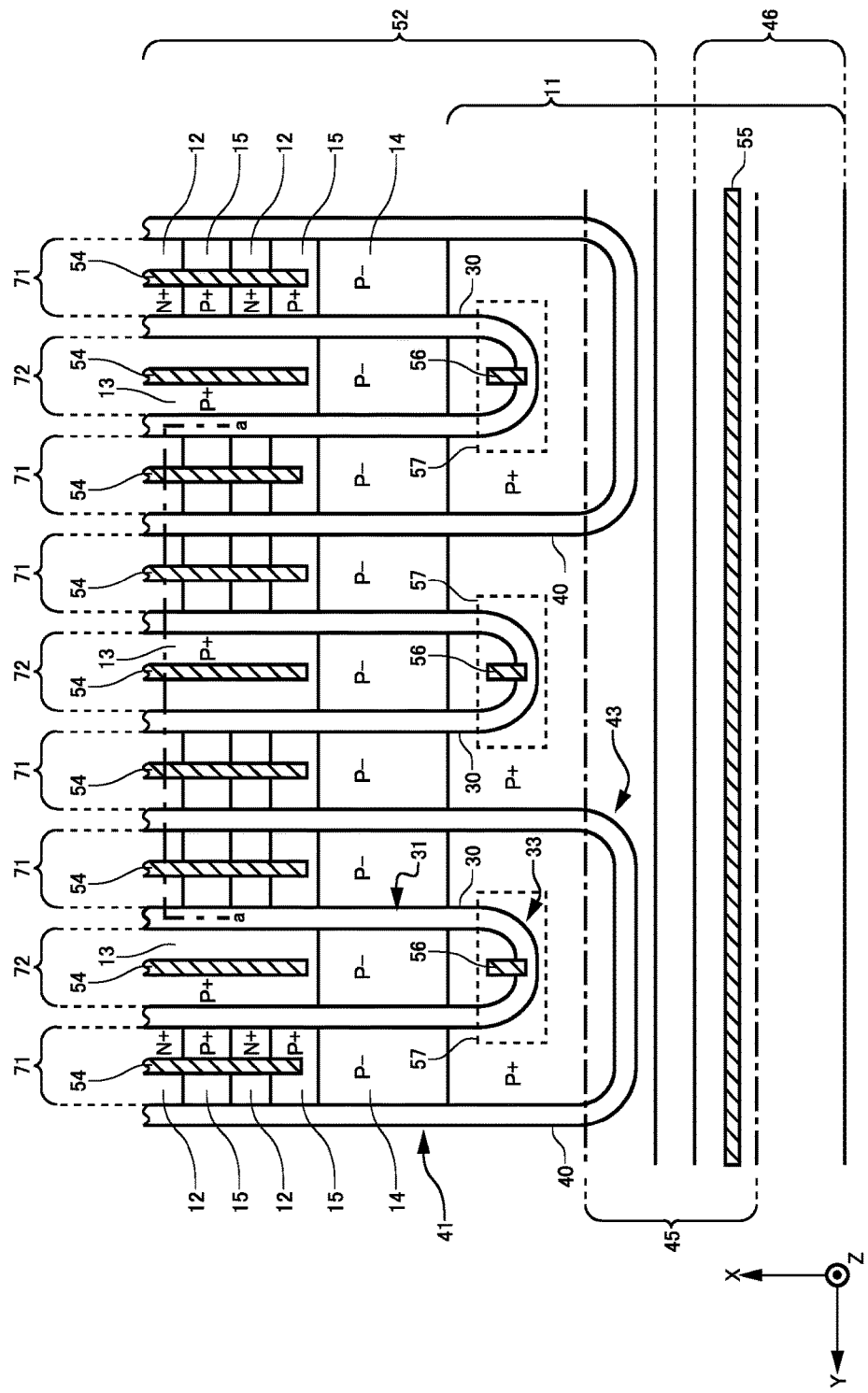
FIG. 1 is a figure showing part of the upper surface of a semiconductor device 100 according to an embodiment of the present invention.

FIG. 1 is a figure showing part of the upper surface of a semiconductor device 100 according to an embodiment of the present invention. The semiconductor device 100 of the present example is a semiconductor chip including a transistor such as an IGBT. In FIG. 1, a chip upper surface around a chip end portion is shown, and other regions are omitted.

Also, although in FIG. 1, an active region of a semiconductor substrate in the semiconductor device 100 is shown, the semiconductor device 100 may have an edge termination portion surrounding the active region. The active region refers to a region where current flows if the semiconductor device 100 is controlled to shift to an ON-state. The edge termination portion relaxes electric field concentration on the upper-surface side of the semiconductor substrate. The edge termination portion has a structure of, for example, a guard ring, a field plate, a RESURF, or a combination of them.

The semiconductor device 100 of the present example includes gate trench portions 40, dummy trench portions 30, emitter regions 12, base regions 14, contact regions 15, first well regions 13 and a second well region 11 that are provided inside the semiconductor substrate. Also, the semiconductor device 100 of the present example includes an emitter electrode 52 and a gate metal layer 46 provided above the upper surface of the semiconductor substrate. The emitter electrode 52 and the gate metal layer 46 are provided separate from each other.

Although an interlayer dielectric film is provided between: the emitter electrode 52 and the gate metal layer 46; and the upper surface of the semiconductor substrate, it is omitted in FIG. 1. The interlayer dielectric film of the present example is provided with contact holes 54, a contact hole 55 and contact holes 56 penetrating the interlayer dielectric film.

The emitter electrode 52 passes the contact holes 54, and contacts the emitter regions 12, the contact regions 15, the base regions 14 and the first well regions 13 at the upper surface of the semiconductor substrate. The contact holes 54 of the present example are provided between respective trench portions. Also, the emitter electrode 52 passes the contact holes 56, and is connected with dummy conductive portions in the dummy trench portions 30. Connection portions 57 formed of a conductive material such as polysilicon to which impurities are doped may be provided between the emitter electrode 52 and the dummy conductive portions. The connection portions 57 are provided at the upper surface of the semiconductor substrate, sandwiching an insulating film such as a thermally oxidized film. In the present example, the contact holes 56 are arranged at edges of the dummy trench portions 30 in the X-axis direction.

The gate metal layer 46 passes the contact hole 55, and contacts a gate runner 45. The gate runner 45 is formed of polysilicon to which impurities are doped or the like. An insulating film such as a thermally oxidized film is provided between the gate runner 45 and the semiconductor substrate. The gate runner 45 is connected with gate conductive portions in the gate trench portions 40 at the upper surface of the semiconductor substrate. The gate runner 45 is not connected with the dummy conductive portions in the dummy trench portions 30. The gate runner 45 of the present example is provided to extend from below the contact hole 55 and to reach edge portions 43 of the gate trench portions 40. At the edge portions 43 of the gate trench portions 40, the gate conductive portions are exposed to the upper surface of the semiconductor substrate, and contact the gate runner 45.

The emitter electrode 52 and the gate metal layer 46 are formed of metal-containing materials. For example, at least a partial region of each electrode is formed of aluminum or an aluminum-silicon alloy. Each electrode may have, at a layer underlying a region formed of aluminum or the like, a barrier metal formed of titanium, a titanium compound or the like. Furthermore, in the contact hole, there may be plugs formed by embedding tungsten or the like such that it contacts the barrier metal, aluminum or the like.

One or more gate trench portions 40 and one or more dummy trench portions 30 are arrayed at predetermined intervals along a predetermined array direction (shorter side direction) at the upper surface of the semiconductor substrate. The array direction in FIG. 1 is the Y-axis direction.

A gate trench portion 40 of the present example may have: two extending portions 41 that extend in linear shapes along an extending direction (the trench longer side direction; the X-axis direction in the present example) perpendicular to the array direction; and an edge portion 43 that connects the two extending portions 41 at edges of the extending portions 41. At least part of the edge portion 43 is preferably formed in a curved line form at the upper surface of the semiconductor substrate. By connecting the edges of the two extending portions 41 of the gate trench portion 40 by the edge portion 43, electric field concentration at end portions of the extending portions 41 can be relaxed. In the present specification, the two extending portions 41 connected by the edge portion 43 are in some cases treated as two gate trench portions 40.

One or more dummy trench portions 30 are provided between respective extending portions 41 of the gate trench portions 40. A dummy trench portion 30 may have an edge portion 33 that connects edges of two extending portions 31, similar to gate trench portions 40. In the present example, a dummy trench portion 30 having two extending portions 31 and an edge portion 33 is provided between respective extending portions 41 of a gate trench portion 40. Dummy trench portions 30 of another example may not have edge portions 33, but have linear shapes. The dummy trench portions 30 are provided at positions to not overlap the gate runner 45. In the present specification, two extending portions 31 connected by an edge portion 33 are in some cases treated as two dummy trench portions 30.

The emitter electrode 52 is provided above the gate trench portions 40, the dummy trench portions 30, the first well regions 13, the second well region 11, the emitter regions 12, the base regions 14 and the contact regions 15. The second well region 11 is provided in a predetermined range, separate from ends of the contact holes 54 in the longer side direction in the direction toward the gate metal layer 46. The diffusion depth of the second well region 11 may be greater than the depths of the gate trench portions 40 and the dummy trench portions 30. Partial regions of the gate trench portions 40 and the dummy trench portions 30 on the gate metal layer 46 side are provided in the second well region 11. Ends of the dummy trench portion 30 in the extending direction and the bottom of the edge portion of the dummy trench portion 30 may be covered by the second well region 11.

In the present example, regions of the semiconductor substrate sandwiched by respective trench portions are referred to as mesa portions 71. However, a region of the semiconductor substrate sandwiched by two dummy trench portions 30 (or two extending portions 31) is referred to as a dummy mesa portion 72. The mesa portions 71 and the dummy mesa portions 72 are regions that are in regions of the semiconductor substrate sandwiched by respective trench portions and are on the upper-surface side past the deepest bottom portions of the trench portions.

A mesa portion 71 is provided with a base region 14. The second well region 11 is of a second conductivity type. The base region 14 is of P$^-$-type having a doping concentration lower than that of the second well region 11, and the second well region 11 is of P$^+$-type.

The upper surface of the base region 14 of the mesa portion 71 is provided with P$^+$-type contact regions 15 having a doping concentration higher than that of the base region 14. The second well region 11 is provided separate, in the direction toward the gate metal layer 46, from a contact region 15, among the contact regions 15 in an active region, that is arranged at an end in the trench portion extending direction. Also, N$^+$-type emitter regions 12 having a doping concentration higher than that of the semiconductor substrate are formed selectively at the upper surface of the base region 14.

Each of the contact regions 15 and the emitter regions 12 is provided to extend from one of trench portions adjacent in the Y-axis direction and to reach the other trench portion. The contact regions 15 and the emitter regions 12 are provided to be exposed to the upper surface of the semiconductor substrate alternately along the trench portion extending direction (X-axis direction). The contact regions 15 and the emitter regions 12 may be provided in a region sandwiched by base regions 14 exposed at both end portions in the X-axis direction at the upper surface of the mesa portion 71.

In a mesa portion 71 of another example, contact regions 15 and emitter regions 12 may also be provided in stripe-forms along the extending direction (X-axis direction). For example, an emitter region 12 is provided in a region adjacent to a trench portion, and a contact region 15 is provided in a region sandwiched by emitter regions 12.

A dummy mesa portion 72 is provided with a second conductivity type first well region 13 having a doping concentration higher than that of a base region 14. First well regions 13 of the present example are of P$^+$-type. The doping concentration of the first well regions 13 may be the same as or different from the doping concentration of the second well region 11. The doping concentration of the first well regions 13 may be five times or ten times higher than the doping concentration of the base regions 14 or higher.

The first well regions 13 are provided exposed to the upper surfaces of the dummy mesa portions 72. The first well regions 13 of the present example are provided in range facing emitter regions 12 and contact regions 15 in mesa portions 71 adjacent in the Y-axis direction. At the upper surface of a dummy mesa portion 72, a first well region 13 is provided continuously in the Y-axis direction from a position contacting one dummy trench portion 30 to a position contacting another dummy trench portion 30. At the upper surface of a dummy mesa portion 72, a first well region 13 may be provided continuously in a region sandwiched by base regions 14 exposed at both end portions in the X-axis direction.

A contact hole 54 provided to a mesa portion 71 is provided above respective regions of contact regions 15 and emitter regions 12. A contact hole 54 provided to a dummy mesa portion 72 is provided above a first well region 13. A contact hole 54 is not provided in regions corresponding to base regions 14 and the second well region 11. The upper surface of a dummy mesa portion 72 may not be provided with an emitter region. A region of the upper surface of a dummy mesa portion 72 where at least a contact hole 54 is formed may be provided with a contact region 15.

Figure 2A:
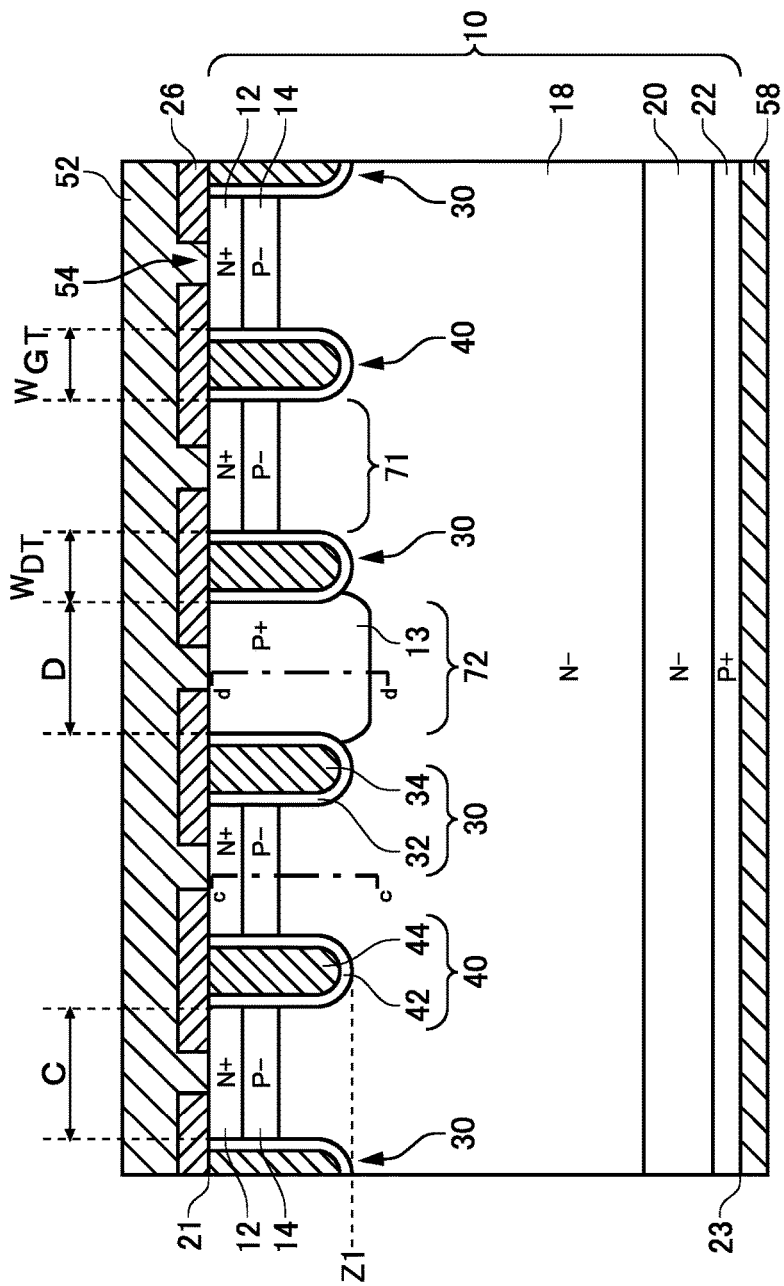
FIG. 2A is a figure showing one example of a cross-section taken along a line a-a in FIG. 1.

FIG. 2A is a figure showing one example of a cross-section taken along a line a-a in FIG. 1. The cross-section taken along the line a-a of the present example is an Y-Z plane passing through emitter regions 12. The semiconductor device 100 of the present example has, in the cross-section, a semiconductor substrate 10, interlayer dielectric films 26, the emitter electrode 52 and a collector electrode 58. The interlayer dielectric films 26 are silicate glass to which impurities such as boron or phosphorus are doped, for example. The interlayer dielectric films 26 are formed selectively on an upper surface 21 of the semiconductor substrate 10. The emitter electrode 52 is provided at the upper surface 21 of the semiconductor substrate 10 and the interlayer dielectric films 26. The collector electrode 58 is provided at a lower surface 23 of the semiconductor substrate 10. The collector electrode 58 may be provided over the entire lower surface 23 of the semiconductor substrate 10.

The semiconductor substrate 10 may be a silicon substrate, a silicon carbide substrate, a nitride semiconductor substrate such as a gallium nitride substrate or the like. The semiconductor substrate 10 of the present example is a silicon substrate.

An N⁻-type drift region 18 is provided inside the semiconductor substrate 10. The drift region 18 in the cross-section is a region of the semiconductor substrate 10 that is left without emitter regions 12, base regions 14, a first well region 13, a buffer region 20 and a collector region 22 being formed therein.

A P⁻-type base region is provided: in a region of the semiconductor substrate 10 adjacent to any of gate trench portions 40; and between the upper surface 21 of the semiconductor substrate 10 and the drift region 18. In the present example, P⁻-type base regions are provided in respective mesa portions 71. The base regions 14 may be formed by implanting P-type impurities such as boron from the upper surface of the semiconductor substrate 10.

In a mesa portion 71, an N⁺-type emitter region 12 is provided at the upper surface of a base region 14. The emitter region 12 may be formed by implanting N-type impurities such as phosphorus or arsenic from the upper surface of the semiconductor substrate 10.

A first well region 13 is provided: in a region of the semiconductor substrate 10 adjacent to any of dummy trench portions 30; and between the upper surface 21 of the semiconductor substrate 10 and the drift region 18. The first well region 13 is provided to extend from the upper surface 21 of the semiconductor substrate 10 and to reach a position deeper than the lower end of the dummy trench portion 30. In the cross-section shown in FIG. 2A, the first well region 13 is provided over an entire dummy mesa portion 72 and in a region below the dummy mesa portion 72.

The lower end of the first well region 13 may be defined based on the doping concentration distribution in the depth direction (Z-axis direction) of the first well region 13 and the drift region 18. In the present specification, the doping concentration refers to the concentration of impurities (dopant) that are doped to be made donors or acceptors. The depth position where the distribution of differences between concentrations of the donor and acceptor (net doping concentration) measured by the spreading resistance (SR) method or the like shows the minimum value may be regarded as the lower end of the first well region 13.

A gate trench portion 40 is formed to extend from the upper surface 21 of the semiconductor substrate 10 and to reach the inside of the semiconductor substrate 10, and contacts, at its side walls, emitter regions 12 and base regions 14. Gate trench portions 40 of the present example do not contact the first well region 13. The gate trench portions 40 of the present example are provided to extend from the upper surface 21 of the semiconductor substrate 10 and penetrate emitter regions 12 and base regions 14.

A dummy trench portion 30 is formed to extend from the upper surface 21 of the semiconductor substrate 10 and to reach the inside of the semiconductor substrate 10, and contacts, at one of its side walls, the first well region 13. One of the side walls of the dummy trench portions 30 that faces a gate trench portion 40 may contact an emitter region 12 and a base region 14. The gate trench portions 40 and the dummy trench portions 30 may be provided to reach the same lower end position Z1 in the Z-axis direction.

A bottom portion of a gate trench portion 40 of the present example is arranged in the drift region 18. A bottom portion of a dummy trench portion 30 may be arranged in the drift region 18 or may be covered by the first well region 13. A configuration in which a trench portion penetrates each doping region is not limited to a configuration that is manufactured by performing processes of forming a doping region and forming a trench portion in this order. A configuration that is manufactured by forming trench portions and then forming a doping region between the trench portions is also included in a configuration in which a trench portion penetrates a doping region.

The buffer region 20 is formed on the lower-surface side of the drift region 18. The doping concentration of the buffer region 20 is higher than the doping concentration of the drift region 18. The buffer region 20 may function as a field stop layer to prevent a depletion layer extending from the lower-surface side of the base regions 14 from reaching the P⁺-type collector region 22. The P⁺-type collector region 22 is formed on the lower-surface side of the buffer region 20.

A gate trench portion 40 has a gate insulating film 42 and a gate conductive portion 44. The gate insulating film 42 is formed covering the inner wall of the gate trench. The gate insulating film 42 may be formed by oxidizing or nitriding a semiconductor at the inner wall of the gate trench. The gate conductive portion 44 is covered by the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes, in the depth direction, a region facing at least an adjacent base region 14, with the gate insulating film 42 being sandwiched therebetween. The gate trench portion 40 in the cross-section is covered by an interlayer dielectric film 26 at the upper surface of the semiconductor substrate 10. If a predetermined voltage is applied to the gate conductive portion 44, a channel is formed by an electron inversion layer at a surface layer of an interface of a base region 14 contacting the gate trench portion 40.

A dummy trench portion 30 of the present example has a dummy insulating film 32 and a dummy conductive portion 34. The dummy insulating film 32 is formed covering the inner wall of the dummy trench. The dummy conductive portion 34 is formed inside the dummy trench portion 30 and is covered by the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have a length in the depth direction which is the same as that of the gate conductive portion 44. The dummy trench portion 30 in the cross-section is covered by an interlayer dielectric film 26 at the upper surface of the semiconductor substrate 10. Bottom portions of dummy trench portions 30 and gate trench portions 40 may have downwardly convex curved surface forms (curved line forms in the cross-section).

The width of a mesa portion 71 and the width of a dummy mesa portion 72 may be equal to each other. The width of a mesa portion 71 is typically 1.0 μm, and may be equal to or greater than 0.1 μm, and equal to or smaller than 3.0 μm. A width $W_{GT}$ of a gate trench portion and a width $W_{DT}$ of a dummy trench portion 30 may be equal to each other or different from each other. In the present example, they are equal. Also, a width C of a mesa portion 71 may be equal to a width D of a dummy mesa portion 72.

The widths of contact holes 54 in the Y-axis direction may be equal to each other in mesa portions 71 and a dummy mesa portion 72. The widths of the contact hole 54 are typically 0.6 μm, and may be equal to or greater than 0.05 μm and equal to or smaller than 2.0 μm as long as they do not exceed mesa widths or dummy mesa widths.

By providing dummy trench portions 30, the carrier accumulation effect can be enhanced to facilitate the conductivity modulation, and lower the ON voltage. Also, by adjusting the ratio of dummy trench portions 30 to gate trench portions 40, the switching speed of the semiconductor device 100 can be adjusted.

At the time of turn-off of the semiconductor device 100, carriers accumulated in the drift region 18 near trench bottom portions are extracted to the emitter electrode 52 through a second conductivity type region. If the carrier extraction speed at the time of turn-off is slow relative to the concentration of accumulated carriers, the withstand capability of the semiconductor device 100 lowers. The carrier extraction speed refers to the amount of carriers such as holes to be extracted from the drift region 18 to the emitter electrode 52 or the like per unit time at the time of turn-off the semiconductor device 100.

In the semiconductor device 100, by providing a first well region 13 formed deeper than dummy trench portions 30, carriers such as holes accumulated near trench bottom portions can be extracted efficiently. Because of this, it is possible both to lower the ON voltage of the semiconductor device 100 and maintain the withstand capability of the semiconductor device 100, easily.

Figure 2B:
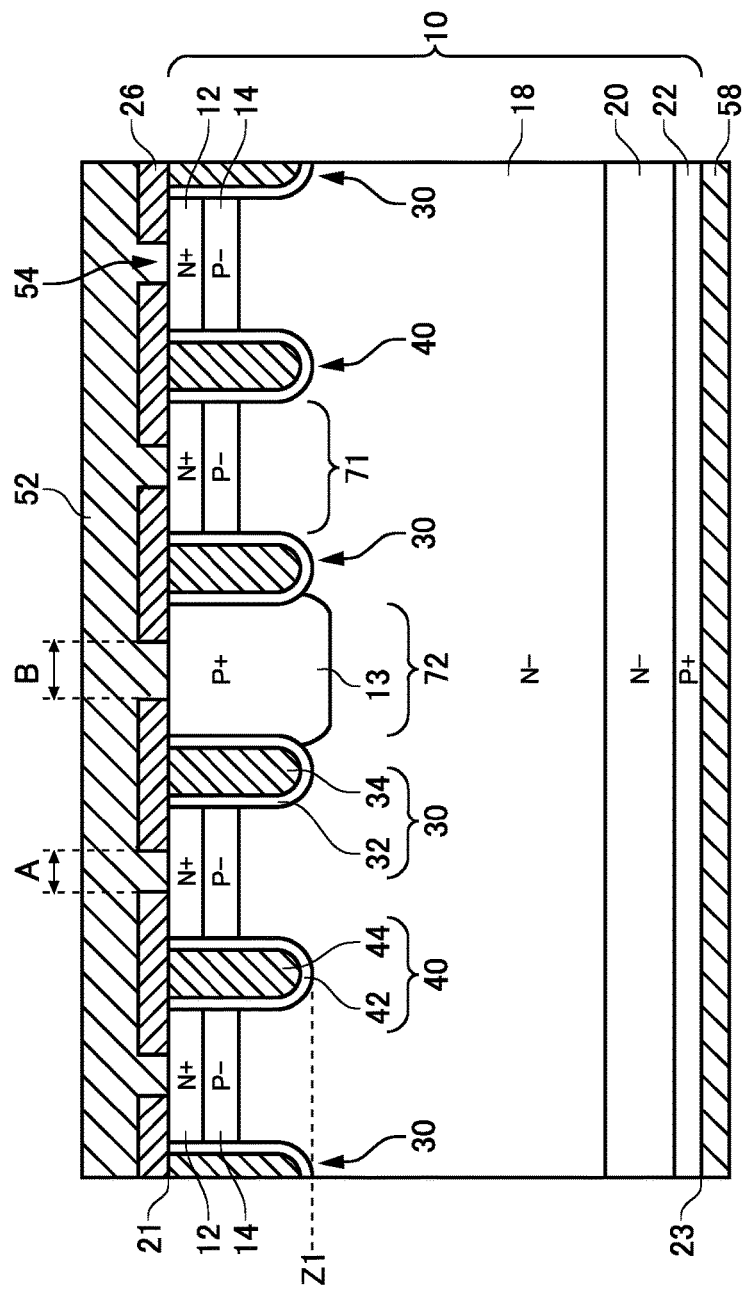
FIG. 2B is a figure showing one example of the cross-section taken along the line a-a in FIG. 1.

FIG. 2B is a figure showing one example of the cross-section taken along the line a-a in FIG. 1. In the semiconductor device 100 of the present example, the contact width of a contact for connecting with the semiconductor substrate 10 is different from that in FIG. 2A. In the present example, a contact width B of a contact formed on the first well region 13 is different from a contact width A of a contact formed on the emitter regions 12. The contact width B of the present example may be greater than or smaller than the contact width A. In the present example, the contact width B is greater than the contact width A. That is, by making the contact width B between dummy trench portions 30 greater than the contact width A between a dummy trench portion 30 and a gate trench portion 40, the turn-off withstand capability of the semiconductor device 100 can be improved.

The ratio between the contact width A and the contact width B (A/B) may be equal to or higher than 0.2 and equal to or lower than 2.0. If the contact width B is greater than the contact width A, the ratio (A/B) may be equal to or higher than 0.2 and lower than 1.0, and furthermore equal to or higher than 0.4 and equal to or lower than 0.7. On the other hand, if the contact width B is smaller than the contact width A, the ratio (A/B) may be higher than 1.0 and equal to or lower than 2.0, and furthermore equal to or higher than 1.3 and equal to or lower than 1.7.

Figure 2C:
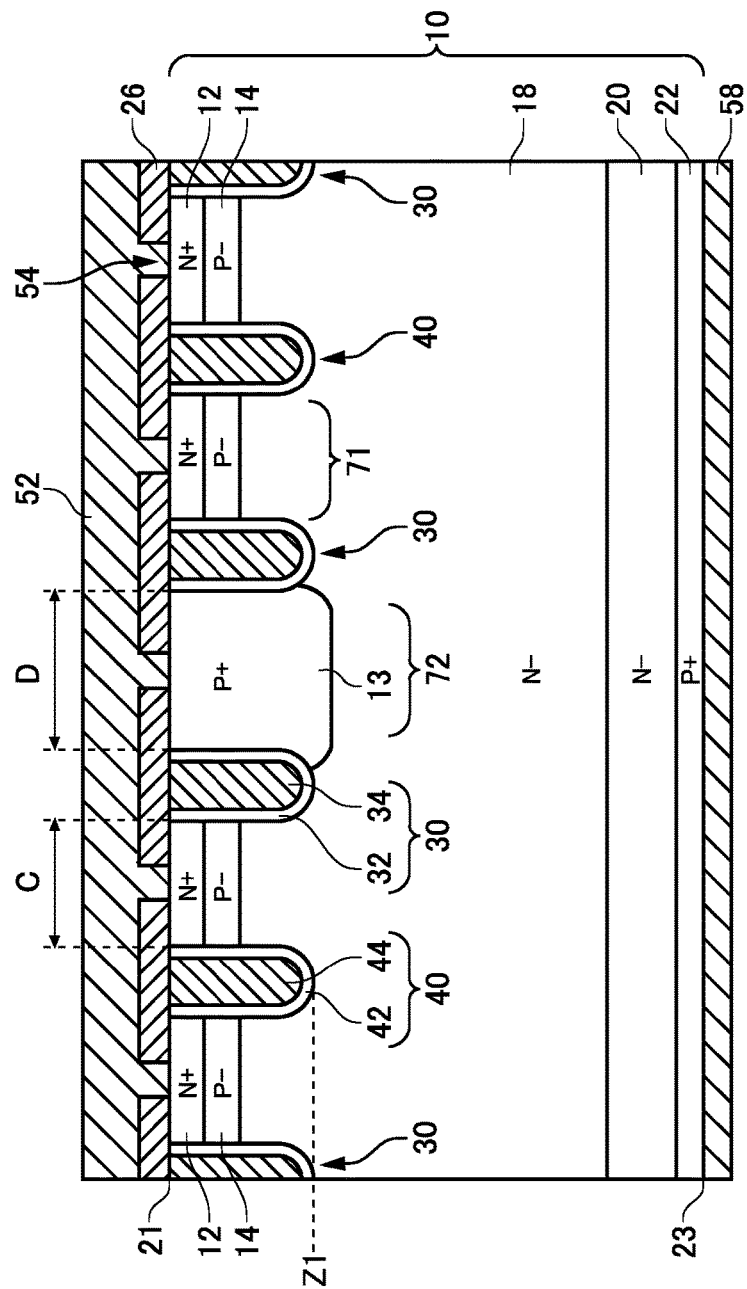
FIG. 2C is a figure showing one example of the cross-section taken along the line a-a in FIG. 1.

FIG. 2C is a figure showing one example of the cross-section taken along the line a-a in FIG. 1. The semiconductor device 100 of the present example is different from that in FIG. 2A in that the width of the dummy mesa portion 72 in the Y-axis direction is different from the width of a mesa portion 71 in the Y-axis direction. In the present example, a width D of a dummy mesa portion 72 is different from a width C of a mesa portion 71 between a dummy trench portion 30 and a gate trench portion 40. The width D of a dummy mesa portion 72 of the present example may be greater than the width C of a mesa portion 71. By making the width D of a dummy mesa portion 72 greater than the width C of another mesa portion 71, the turn-off withstand capability of the semiconductor device 100 can be improved.

The ratio (D/C) between the width C of a mesa portion 71 and the width D of a dummy mesa portion 72 may be greater than 0.2 and equal to or lower than 5.0. If the width D of a dummy mesa portion 72 is smaller than the width C of a mesa portion 71, the ratio (D/C) may be equal to or higher than 0.2 and lower than 1.0, and furthermore equal to or higher than 0.4 and equal to or lower than 0.7. On the other hand, if the width D of a dummy mesa portion 72 is greater than the width C of a mesa portion 71, the ratio (D/C) may be higher than 1.0 and equal to or lower than 5.0, and furthermore equal to or higher than 2.0 and equal to or lower than 4.0.

Figure 2D:
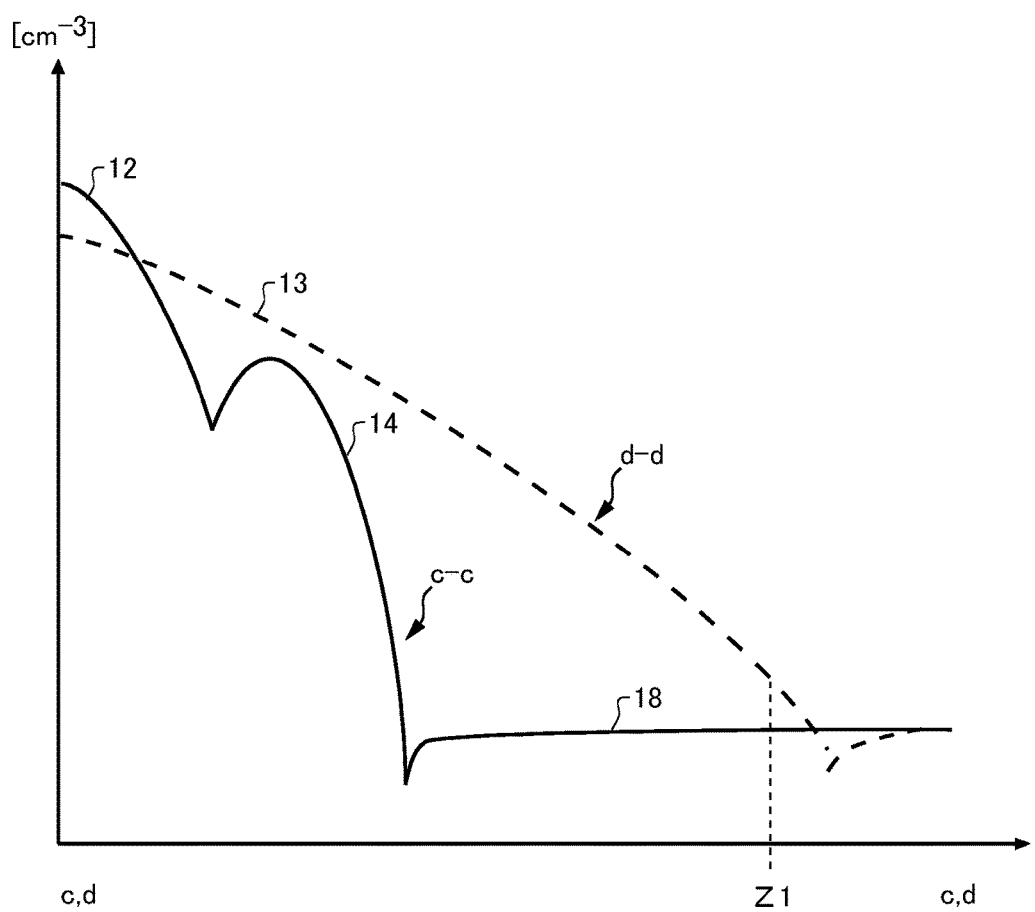
FIG. 2D is an example of diagrams showing doping concentration distribution observed in a cross-section taken along a line c-c in FIG. 2A and a cross-section taken along a line d-d in FIG. 2A.

FIG. 2D is an example of diagrams showing doping concentration distribution observed in a cross-section taken along a line c-c in FIG. 2A and a cross-section taken along a line d-d in FIG. 2A. In the cross-section taken along the line c-c, an emitter region 12, a base region 14 and the drift region 18 are arranged in this order from the upper-surface side of the semiconductor substrate 10. In the cross-section taken along the line d-d, the doping concentration distribution in a first well region 13 may have a Gaussian distribution-like form from the upper surface of the semiconductor substrate 10. The Gaussian distribution is a profile observed when dopant introduced at the upper surface of the semiconductor substrate 10 is diffused by thermal diffusion.

The depth from the upper surface of the p-n junction between the base region 14 and the drift region 18, that is, the depth of the base region 14 is deeper than a lower end position Z1 of the trench portion. On the other hand, the depth of the p-n junction between the first well region 13 and the drift region 18, that is, the depth of the first well region 13 may be deeper than the lower end position Z1 of the trench portion. The depth of the base region 14 is typically 3.0 μm, and may be equal to or greater than 0.5 μm and equal to or smaller than 5.0 μm. The depth of the first well region 13 is typically 7.0 μm, and may be equal to or greater than 2.0 μm and equal to or smaller than 10 μm.

Figure 2E:
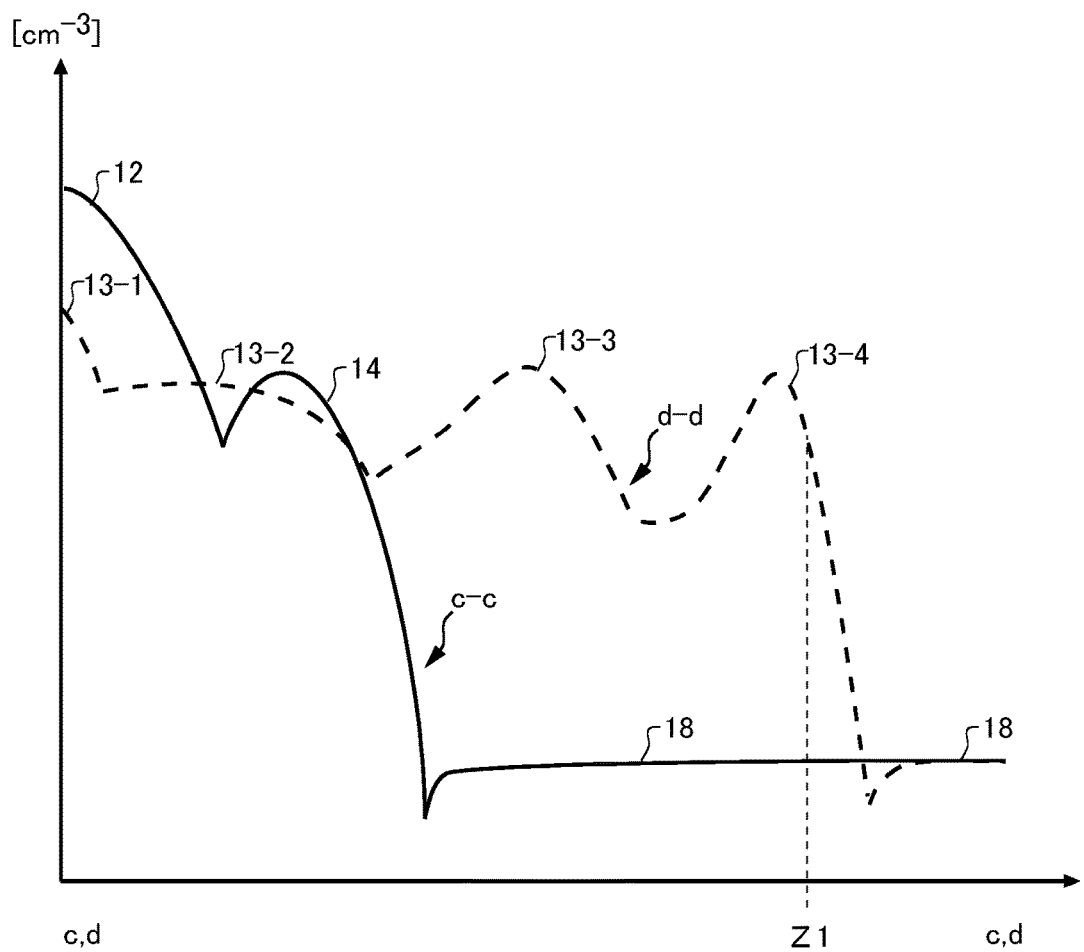
FIG. 2E is another example of diagrams showing doping concentration distribution observed in the cross-section taken along the line c-c in FIG. 2A and the cross-section taken along the line d-d in FIG. 2A.

FIG. 2E is another example of diagrams showing doping concentration distribution observed in the cross-section taken along the line c-c in FIG. 2A and the cross-section taken along the line d-d in FIG. 2A. The doping concentration distribution in the cross-section taken along the line c-c of the present example is the same as the doping concentration distribution in the cross-section taken along the line c-c in FIG. 2D. In the present example, the doping concentration distribution of the cross-section taken along the line d-d is different from that in FIG. 2D. The first well region 13 of the present example has four peaks, which are a first well region 13-1 to a first well region 13-4. For example, in the cross-section taken along the line d-d, the doping concentration distribution of the first well region 13 consists of: a first step where the contact resistance lowers; a second step having the doping concentration distribution which is almost the same as that of the base region 14; a third step having the concentration peak at a position deeper than that of the base region 14; and a fourth step having the concentration peak at a position still deeper than that of the third step.

The number, depths, and so on, of the peak positions of the first well region 13 are not limited to this example. The fourth step of the first well region 13 contacts the drift region 18 and has a p-n junction. The minimum concentration of a valley portion between respective concentration peaks may be higher than the doping concentration of the drift region 18. The peak concentrations of the third step and fourth step of the first well region 13 in FIG. 2E may be higher than the peak concentration of the base region 14 or may be lower than the peak concentration of the base region 14.

Also, the peak position of the third step may be deeper than the position of the p-n junction between the base region 14 and the drift region 18. Also, the peak position of the fourth step may be shallower than the lower end position Z1 of the trench portion.

Figure 3:
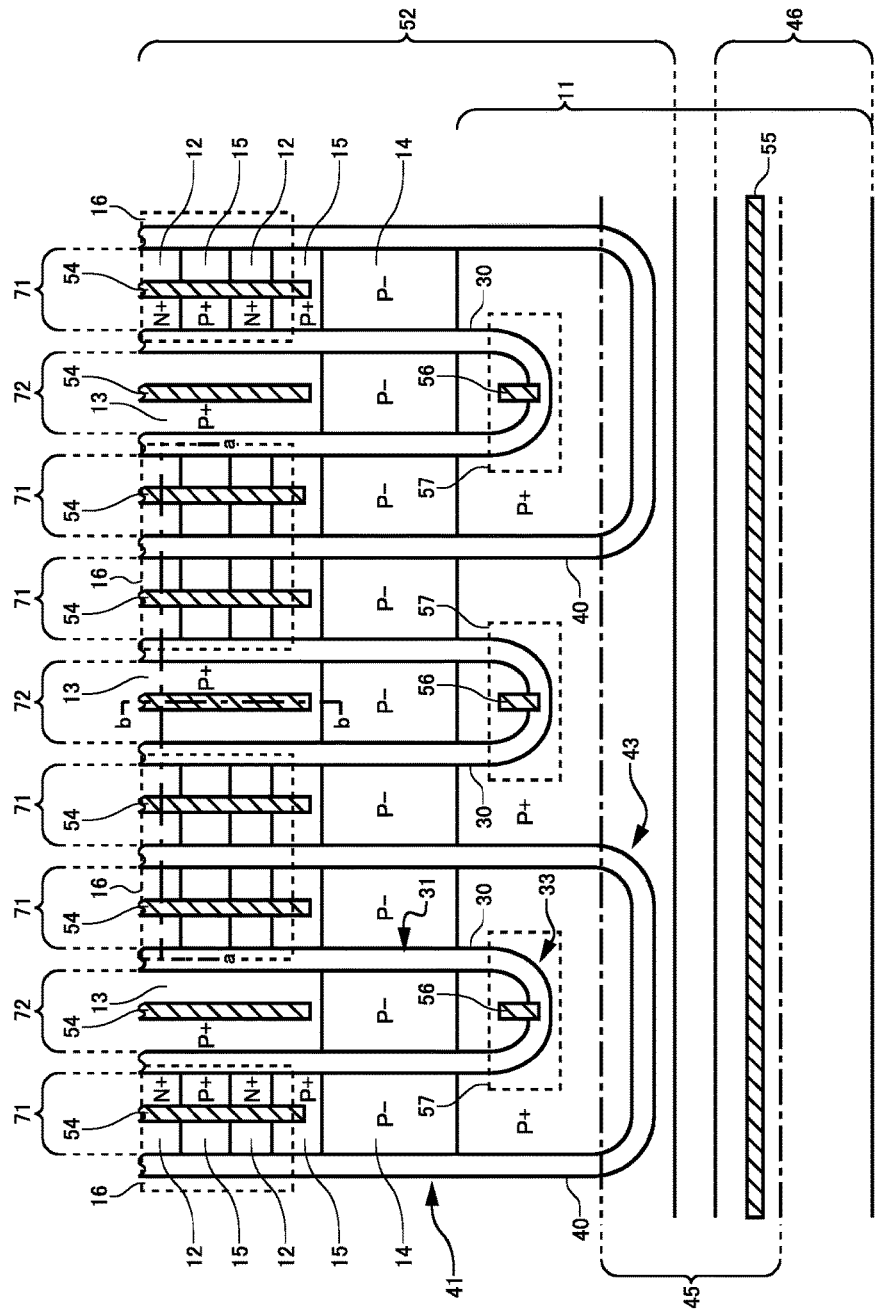
FIG. 3 is a figure showing another example of the upper surface of the semiconductor device 100.

FIG. 3 is a figure showing another example of the upper surface of the semiconductor device 100. The semiconductor device 100 of the present example further includes accumulation regions 16 in the configuration of the semiconductor device 100 explained in FIG. 1 and FIG. 2A. The accumulation regions 16 are first conductivity type regions having a doping concentration higher than that of the drift region 18. The accumulation regions 16 of the present example are of $N^+$-type.

The accumulation regions 16 are not exposed to the upper surface of the semiconductor substrate 10. The accumulation regions 16 may be formed between the drift region 18 and the base regions 14. In FIG. 3, the regions provided with the accumulation regions 16 in the XY plane parallel with the upper surface 21 of the semiconductor substrate 10 are indicated with broken lines. In the present example, a plurality of accumulation regions 16 separate from each other in the plane are provided.

An accumulation region 16 is provided in at least a partial region of a mesa portion 71 sandwiched by two trench portions at least one of which is a gate trench portion 40. The accumulation regions 16 of the present example are provided at least below emitter regions 12. The accumulation regions 16 may be provided also below contact regions 15. The accumulation region 16 of the present example are provided over entire mesa portions 71 in the width direction (Y-axis direction). An accumulation region 16 may not be provided below a base region 14 exposed to the upper surface of a mesa portion 71. In contrast to this, dummy mesa portions 72 are not provided with accumulation regions 16 having a doping concentration higher than that of the base regions 14.

Figure 4A:
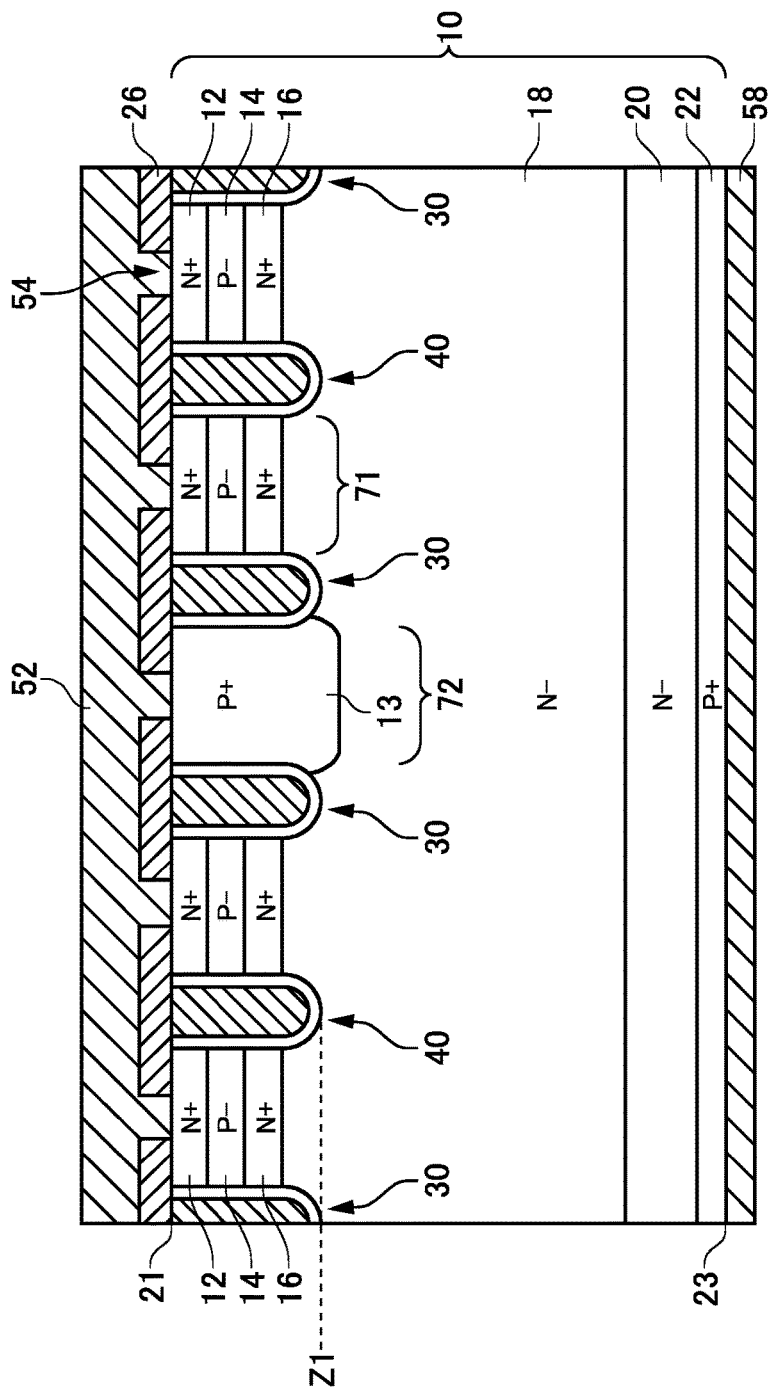
FIG. 4A is a figure showing one example of a cross-section taken along a line a-a in FIG. 3.

FIG. 4A is a figure showing one example of a cross-section taken along a line a-a in FIG. 3. The cross-section taken along the line a-a of the present example is a Y-Z plane passing through emitter regions 12. The semiconductor device 100 of the present example further includes accumulation regions 16 in the configuration of the semiconductor device 100 shown in FIG. 2A. An accumulation region 16 is provided between a base region 14 and the drift region 18 in each mesa portion 71. An accumulation region 16 of the present example is provided, in each mesa portion 71, to extend from a region adjacent to one of adjacent trench portions and to reach a region adjacent to the other trench portion.

The accumulation regions 16 are $N^+$-type regions having a doping concentration higher than that of the drift region 18. For example, a region that is between the drift region 18 and a base region 14 and has the doping concentration that is ten times higher than the average value of the doping concentration of the drift region 18 or higher may be regarded as an accumulation region 16. The doping concentration of an accumulation region 16 may be fifty times or a hundred times higher than the doping concentration of the drift region 18 or higher. Accumulation regions 16 may be formed by implanting N-type impurities such as phosphorus or proton from the upper surface 21 of the semiconductor substrate 10.

By providing accumulation regions 16, the concentration of carriers accumulated below the accumulation regions 16 can further be increased. Because of this, the ON voltage of the semiconductor device 100 can be lowered. Also, by providing a first well region 13, carriers accumulated in the accumulation regions 16 can be extracted efficiently. Because of this, even if the accumulation regions 16 are provided, the withstand capability of the semiconductor device 100 can be maintained.

Figure 4B:
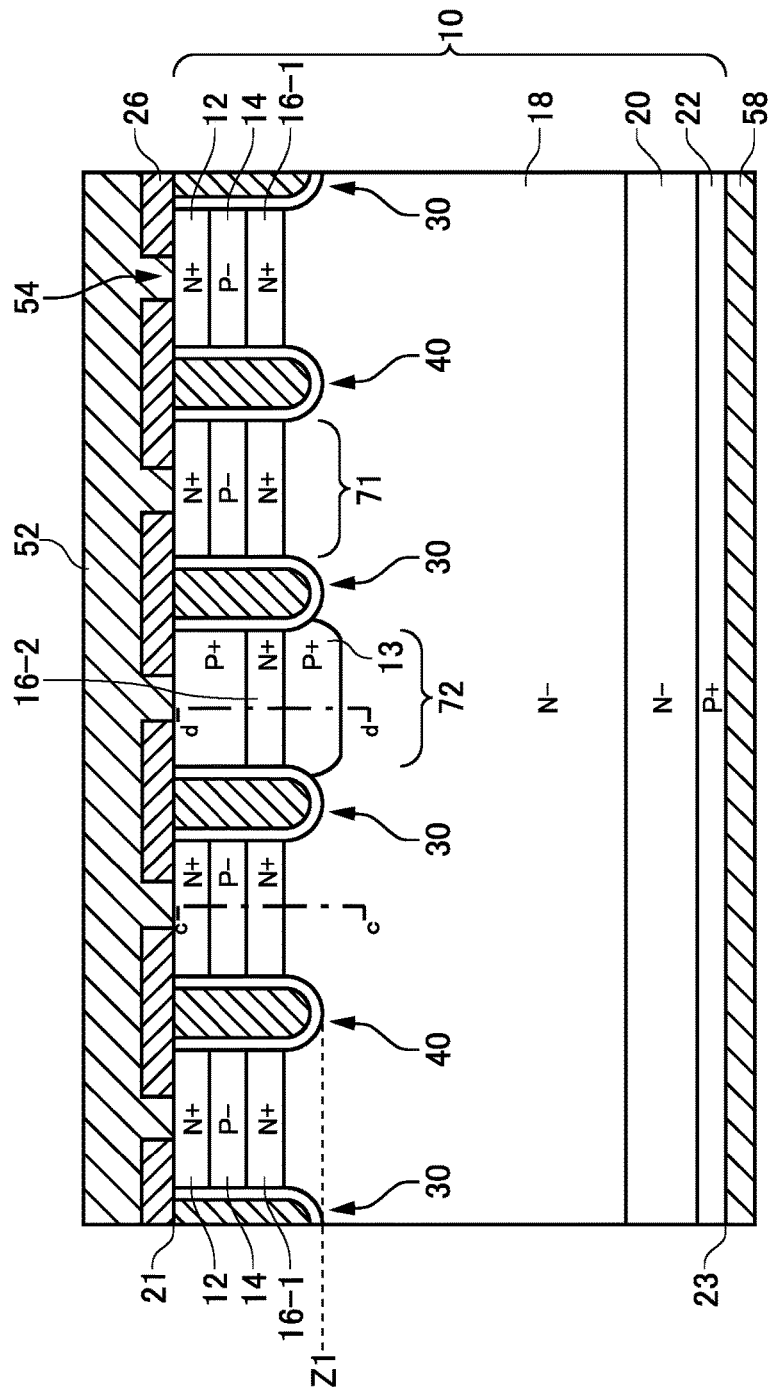
FIG. 4B is a figure showing one example of the cross-section taken along the line a-a in FIG. 3.

FIG. 4B is a figure showing one example of the cross-section taken along the line a-a in FIG. 3. The semiconductor device 100 of the present example is different from that in FIG. 4A in that it has an accumulation region 16 in a dummy mesa portion 72. The accumulation regions 16 of the present example include accumulation regions 16-1 formed in mesa portions 71 and an accumulation region 16-2 formed in the dummy mesa portion 72. The accumulation regions 16-1 and the accumulation region 16-2 may be formed simultaneously in a single process. Also, the accumulation regions 16-1 and the accumulation region 16-2 may be formed at different dopant concentrations in different processes.

The accumulation region 16-2 is formed in the dummy mesa portion 72 and sandwiched by dummy trench portions 30. That is, the upper end and lower end of the accumulation region 16-2 is provided in contact with a first well region 13. The accumulation region 16-2 is a first conductivity type region having a doping concentration higher than that of the drift region 18. By providing the accumulation region 16-2 to the dummy mesa portion 72, the semiconductor device 100 of the present example can suppress extraction of carriers through a P-type inversion layer at a bottom portion of the dummy trench portion 30 at the time of turn-on and can reduce the turn-on loss.

Figure 4C:
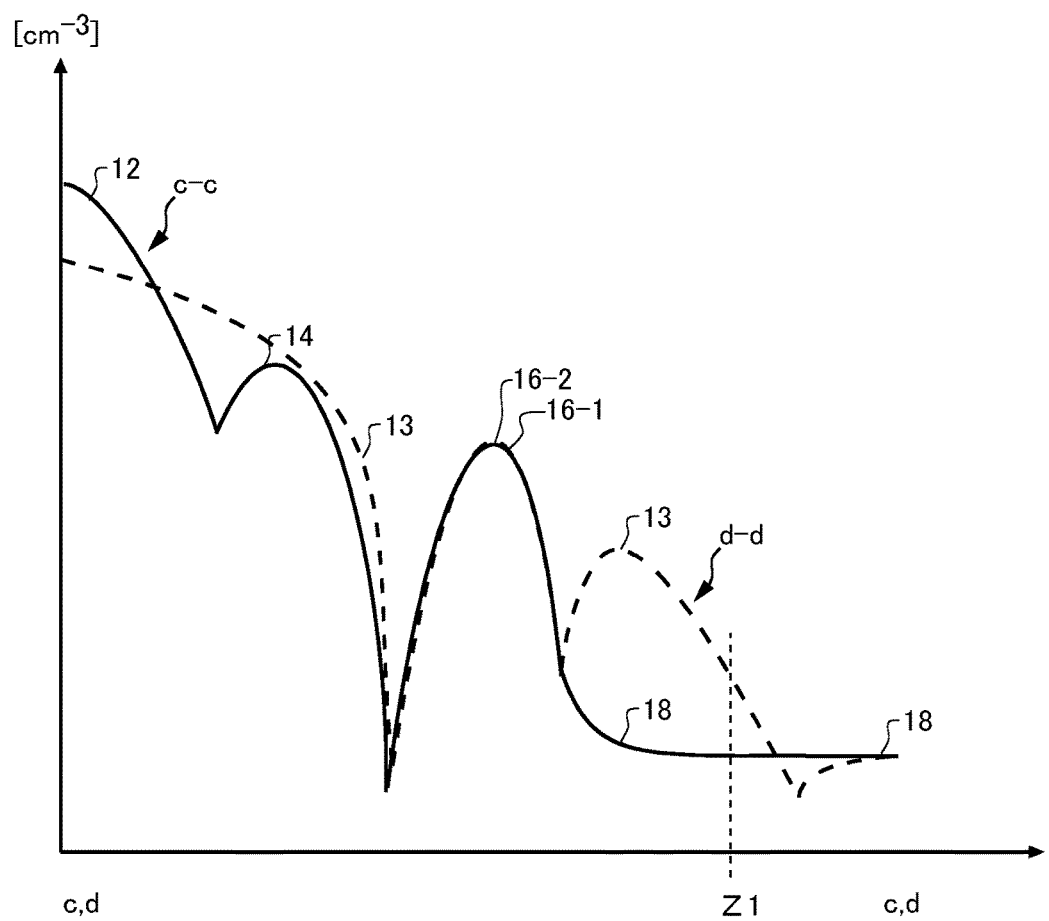
FIG. 4C is an example of diagrams showing doping concentration distribution observed in a cross-section taken along a line c-c in FIG. 4B and a cross-section taken along a line d-d in FIG. 4B.

FIG. 4C is an example of diagrams showing doping concentration distribution observed in a cross-section taken along a line c-c in FIG. 4B and a cross-section taken along a line d-d in FIG. 4B. In the cross-section taken along the line c-c, an emitter region 12, a base region 14 and the drift region 18 are arranged in this order from the upper-surface side of the semiconductor substrate 10. In the cross-section taken along the line d-d, the doping concentration distribution in a first well region 13 may have a Gaussian distribution-like form from the upper surface of the semiconductor substrate 10. The Gaussian distribution is a profile observed when dopant introduced at the upper surface of the semiconductor substrate 10 is diffused by thermal diffusion.

The depth from the upper surface of the semiconductor substrate 10 to the peak position of the doping concentration of the accumulation regions 16 may be deeper than the depth from the peak position to the lower end position Z1 of the trench portions. The peak position of the accumulation regions 16 is typically 4.0 μm, and may be equal to or greater than 1.0 μm and equal to or smaller than 6.0 μm.

Figure 4D:
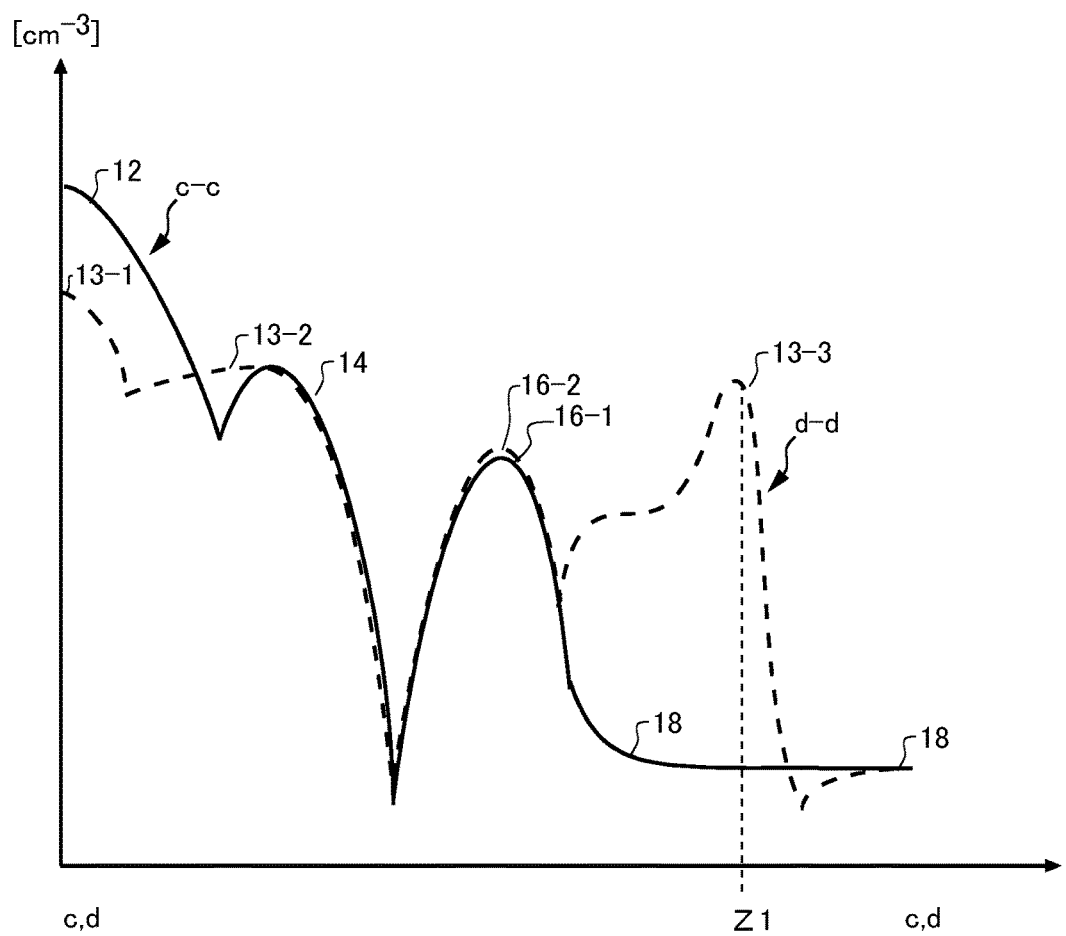
FIG. 4D is another example of diagrams showing doping concentration distribution observed in the cross-section taken along the line c-c in FIG. 4B and the cross-section taken along the line d-d in FIG. 4B.

FIG. 4D is another example of diagrams showing doping concentration distribution observed in the cross-section taken along the line c-c in FIG. 4B and the cross-section taken along the line d-d in FIG. 4B. The doping concentration distribution of the cross-section taken along the line d-d is different from that in FIG. 2D. The first well region 13 of the present example has three peaks, which are a first well region 13-1 to a first well region 13-3. For example, in the cross-section taken along the line d-d, the doping concentration distribution consists of: a first step of the first well region 13 where the contact resistance lowers; a second step of the first well region 13 with the distribution which is almost the same as that of the base region 14; a third step of the first well region 13 including the concentration peak at a position deeper than those of the accumulation region 16-2 and the accumulation region 16-2. The peak concentration of the third step of the first well region 13 in FIG. 4D may be higher than the peak concentration of the accumulation region 16-2 or may be lower than the peak concentration of the accumulation region 16-2. In the present example, the peak concentration of the third step of the first well region 13 is higher than the peak concentration of the accumulation region 16-2.

Figure 4E:
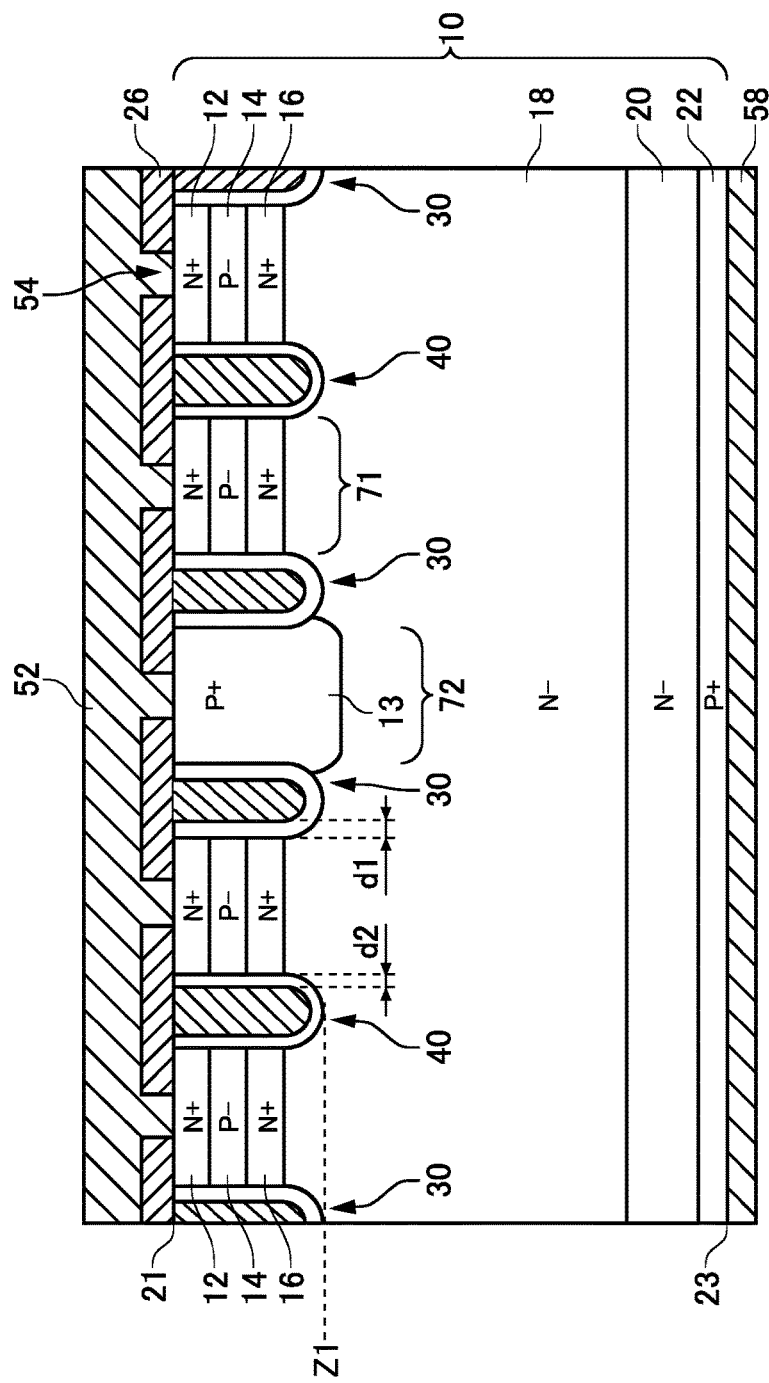
FIG. 4E is a figure showing one example of the cross-section taken along the line a-a in FIG. 3.

FIG. 4E is a figure showing one example of the cross-section taken along the line a-a in FIG. 3. The semiconductor device 100 of the present example is different from that in FIG. 4A in that a film thickness d1 of a dummy insulating film 32 is different from a film thickness d2 of a gate insulating film 42. The film thickness d1 of the dummy insulating film 32 of the present example is greater than the film thickness d2 of the gate insulating film 42. Thereby, it is possible to suppress extraction of carriers through a P-type inversion layer at a bottom portion of the dummy trench portion 30 at the time of turn-on and can reduce the turn-on loss. The film thickness d2 is typically 0.1 µm, and may be equal to or greater than 0.05 µm and equal to or smaller than 0.3 µm. The film thickness d1 is typically 0.2 µm, and may be in a range greater than the film thickness d2 and equal to or greater than 0.1 µm and equal to or smaller than 1.0 µm. Thereby, it is possible to suppress extraction of carriers through a P-type inversion layer at a bottom portion of the dummy trench portion 30 at the time of turn-on and can reduce the turn-on loss.

Because in the present example, the widths of dummy trench portions 30 and gate trench portions 40 in the Y-axis direction are the same, and the film thickness d1 of the dummy insulating film 32 becomes thick, the width of a dummy conductive portion 34 in the Y-axis direction becomes smaller than the width of a gate conductive portion 44 in the Y-axis direction. The film thickness d1 of the dummy insulating film 32 may be made greater than the film thickness d2 of the gate insulating film 42 by making the width of the dummy trench portions 30 in the Y-axis direction greater than the width of the gate trench portions 40 in the Y-axis direction.

Figure 5:
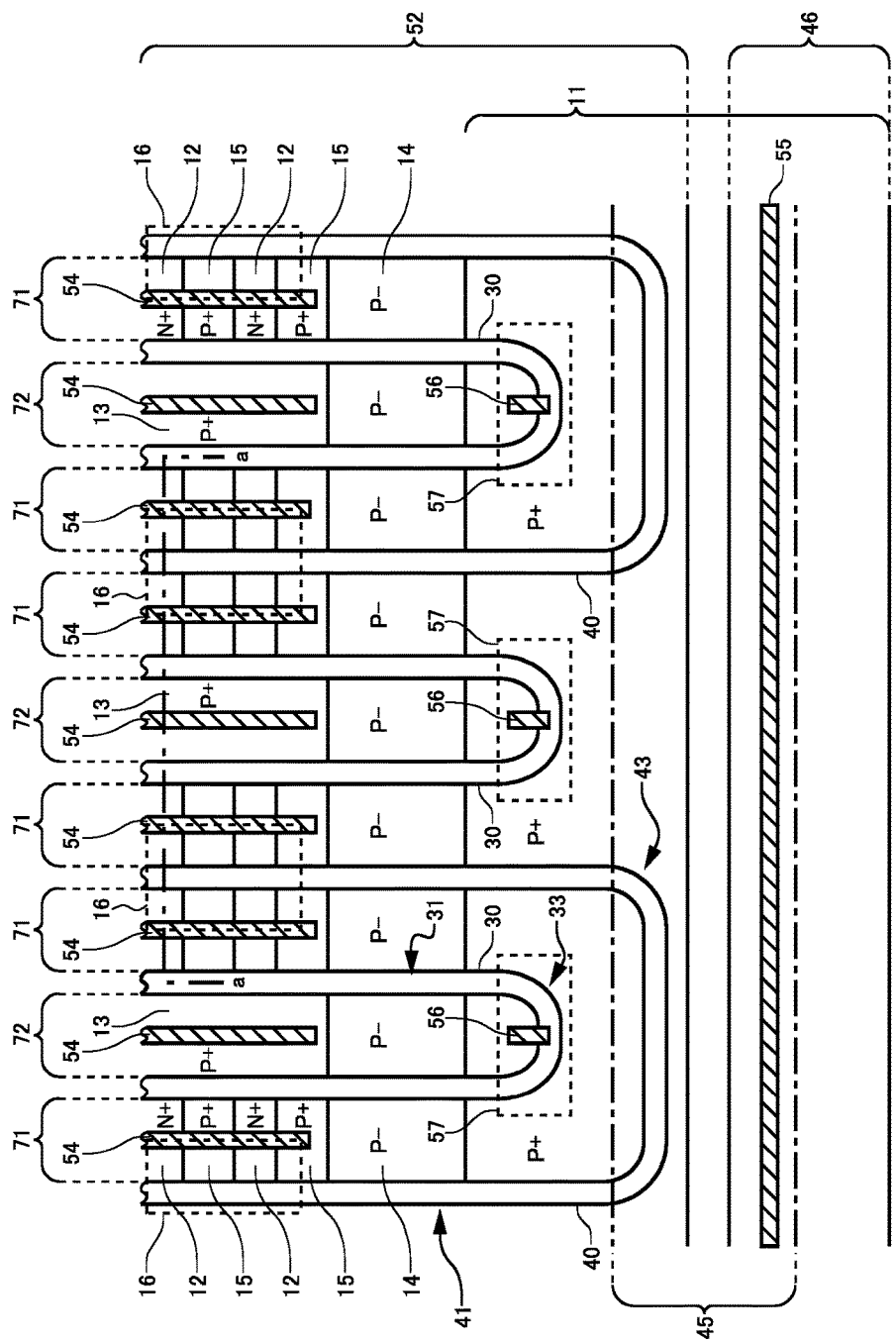
FIG. 5 is a figure showing another example of the upper surface of the semiconductor device 100.

FIG. 5 is a figure showing another example of the upper surface of the semiconductor device 100. The semiconductor device 100 of the present example has a configuration different from the configuration of the semiconductor device 100 shown in FIG. 3 and FIG. 4A in terms of the arrangement of accumulation regions 16. In other respects, it has the same configuration as that of the semiconductor device 100 shown in FIG. 3 and FIG. 4A.

Accumulation regions 16 of the present example are not provided in regions adjacent, on at least one of the sides, to trench portions in at least some mesa portions 71. In the example of FIG. 5, in respective mesa portions 71, accumulation regions 16 contact gate trench portions 40, but do not contact dummy trench portions 30. Also, accumulation regions 16 are not provided in dummy mesa portions 72.

Figure 6:
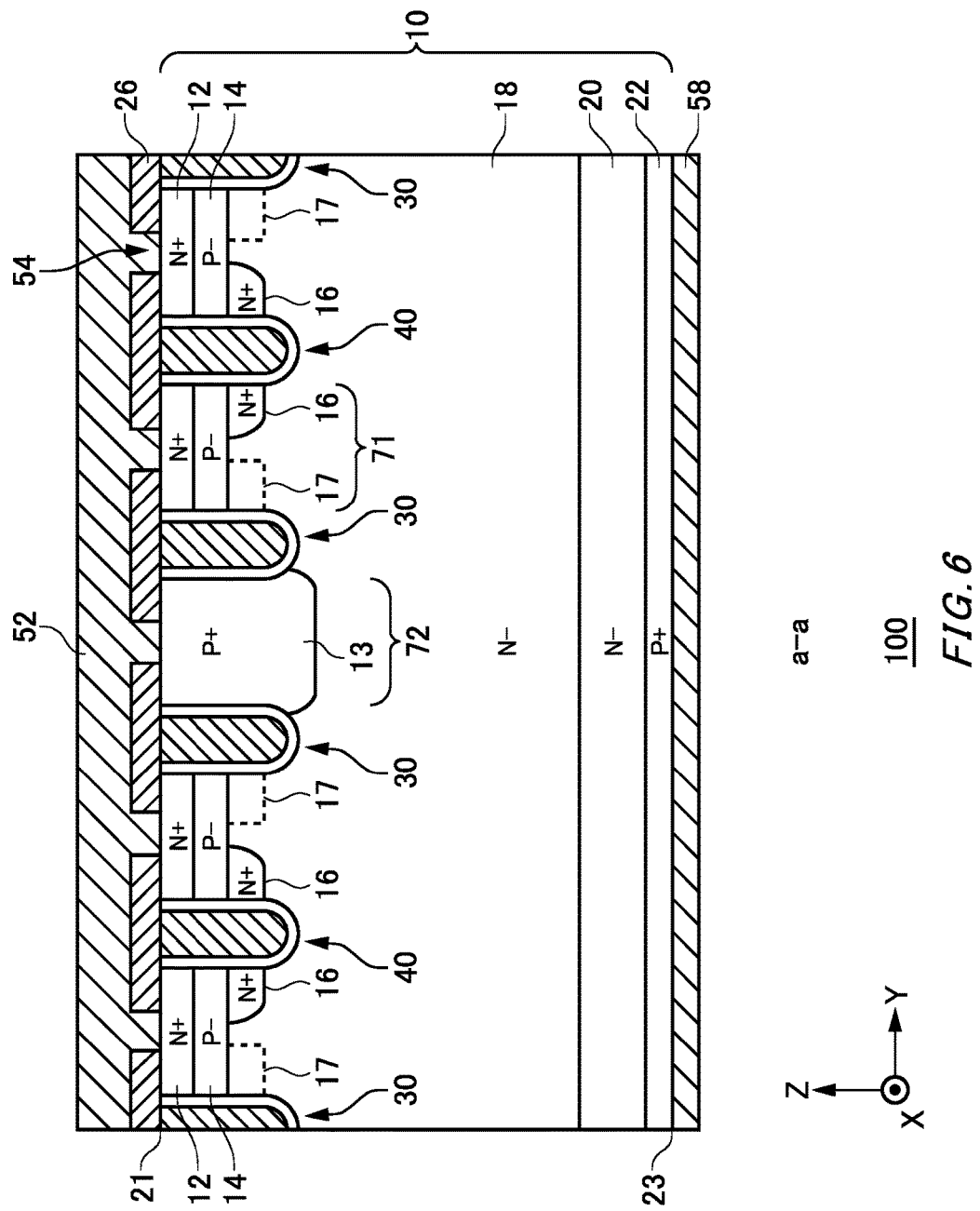
FIG. 6 is a figure showing one example of a cross-section taken along a line a-a in FIG. 5.

FIG. 6 is a figure showing one example of a cross-section taken along a line a-a in FIG. 5. The cross-section taken along the line a-a of the present example is a Y-Z plane passing through emitter regions 12. The semiconductor device 100 of the present example has a configuration different from the configuration of the semiconductor device 100 shown in FIG. 4A in terms of the arrangement of accumulation regions 16. In other respects, it has the same configuration as that of the semiconductor device 100 shown in FIG. 4A.

Accumulation regions 16 of the present example are provided in regions adjacent to gate trench portions 40 inside the semiconductor substrate 10. The accumulation regions 16 may be provided in contact with base regions 14 or may be provided separate from the base regions 14. However, the accumulation regions 16 are preferably provided inside mesa portions 71 (that is, in regions from the upper surface 21 of the semiconductor substrate 10 the lower ends of trench portions).

In respective mesa portions 71, the N-type doping concentrations of regions 17 that are adjacent to dummy trench portions 30 inside the semiconductor substrate 10 and are at the same depth position as the accumulation regions 16 is lower than that of the accumulation regions 16. The regions 17 of the present example have a doping concentration which is the same as that of the drift region 18. The accumulation regions 16 may be provided in regions at or below or regions at or above the middle point of the width of the mesa portions 71 in the Y-axis direction.

With such a structure, carriers can be accumulated near the lower ends of gate trench portions 40, and at the time of turn-off, carriers such as holes can be extracted also from mesa portions 71. For example, carriers that passed through the vicinity of dummy trench portions 30 pass through base regions 14 and contact regions 15, and extracted to the emitter electrode 52.

Figure 7:
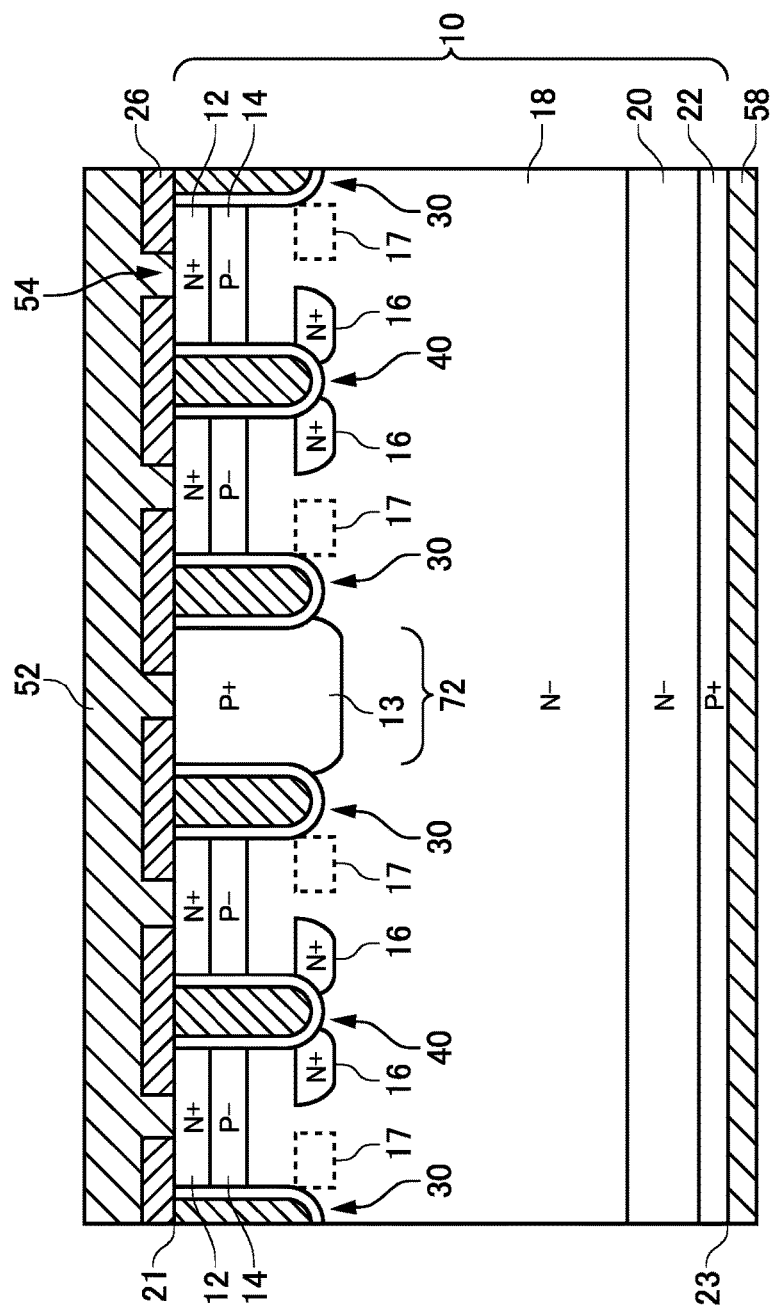
FIG. 7 is a figure showing another example of the cross-section taken along the line a-a in FIG. 5.

FIG. 7 is a figure showing another example of the cross-section taken along the line a-a in FIG. 5. The semiconductor device 100 of the present example has a configuration different from the configuration of the semiconductor device 100 shown in FIG. 6 in terms of the arrangement of accumulation regions 16 in the Z-axis direction. In other respects, it has the same configuration as that of the semiconductor device 100 shown in FIG. 6.

The accumulation regions 16 of the present example are arranged separate from base regions 14. The drift region 18 may be provided between the accumulation regions 16 and the base regions 14. The accumulation regions 16 contact gate trench portions 40, but do not contact dummy trench portions 30. Partial regions of the accumulation region 16 may be provided lower than the lower ends of the gate trench portions 40.

Bottom portions of the gate trench portions 40 of the present example have downwardly convex curved surface shapes. The accumulation regions 16 may cover parts of the curved surfaces at the bottom portions of the gate trench portion 40. With such a structure also, carriers can be accumulated near the lower ends of gate trench portions 40, and at the time of turn-off, carriers such as holes can be extracted also from mesa portions 71.

Figure 8:
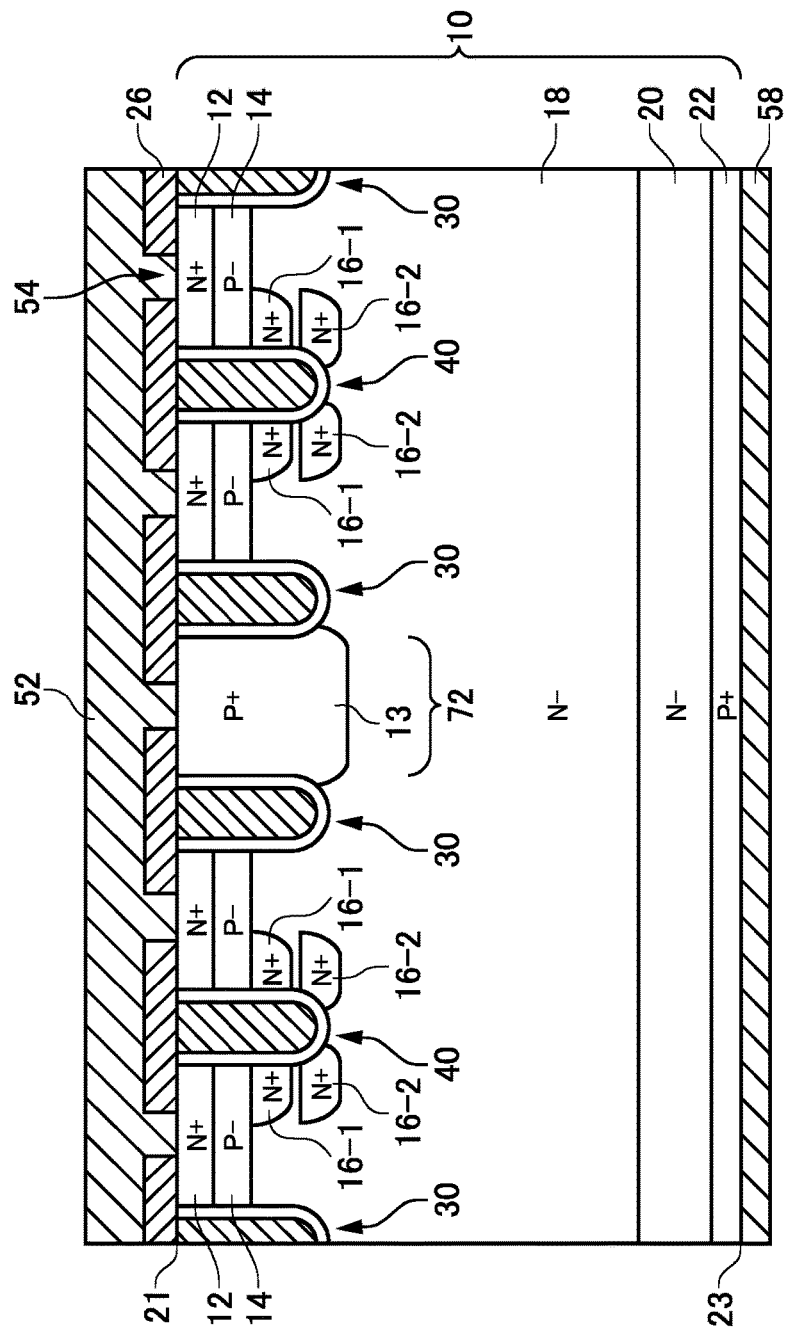
FIG. 8 is a figure showing another example of the cross-section taken along the line a-a in FIG. 5.

FIG. 8 is a figure showing another example of the cross-section taken along the line a-a in FIG. 5. The semiconductor device 100 of the present example has a configuration different from the configuration of the semiconductor device 100 shown in FIG. 6 in terms of the arrangement of accumulation regions 16. In other respects, it has the same configuration as that of the semiconductor device 100 shown in FIG. 6.

The semiconductor device 100 of the present example has a first accumulation region 16-1 and a second accumulation region 16-2 in each mesa portion 71. The first accumulation region 16-1 is the same as the accumulation region 16 shown in FIG. 6, and the second accumulation region 16-2 is the same as the accumulation region 16 shown in FIG. 7.

The first accumulation region 16-1 and the second accumulation region 16-2 may have the same doping concentration or may have different doping concentrations. As seen in the Z-axis direction, at least a partial region of the first accumulation region 16-1 and at least a partial region of the second accumulation region 16-2 are arranged overlapping one another.

The first accumulation region 16-1 and the second accumulation region 16-2 may be provided separate from each other in the Z-axis direction. In this case, the drift region 18 may be provided between the first accumulation region 16-1 and the second accumulation region 16-2. The first accumulation region 16-1 and the second accumulation region 16-2 may be provided continuously in the Z-axis direction. In this case, the doping concentration distributions of the first accumulation region 16-1 and the second accumulation region 16-2 in the depth direction may have peaks in respective regions of the first accumulation region 16-1 and the second accumulation region 16-2. The doping concentration between the peaks is higher than the doping concentration of the drift region 18.

With such a structure also, carriers can be accumulated near the lower ends of gate trench portions 40, and at the time of turn-off, carriers such as holes can be extracted also from mesa portions 71.

Figure 9:
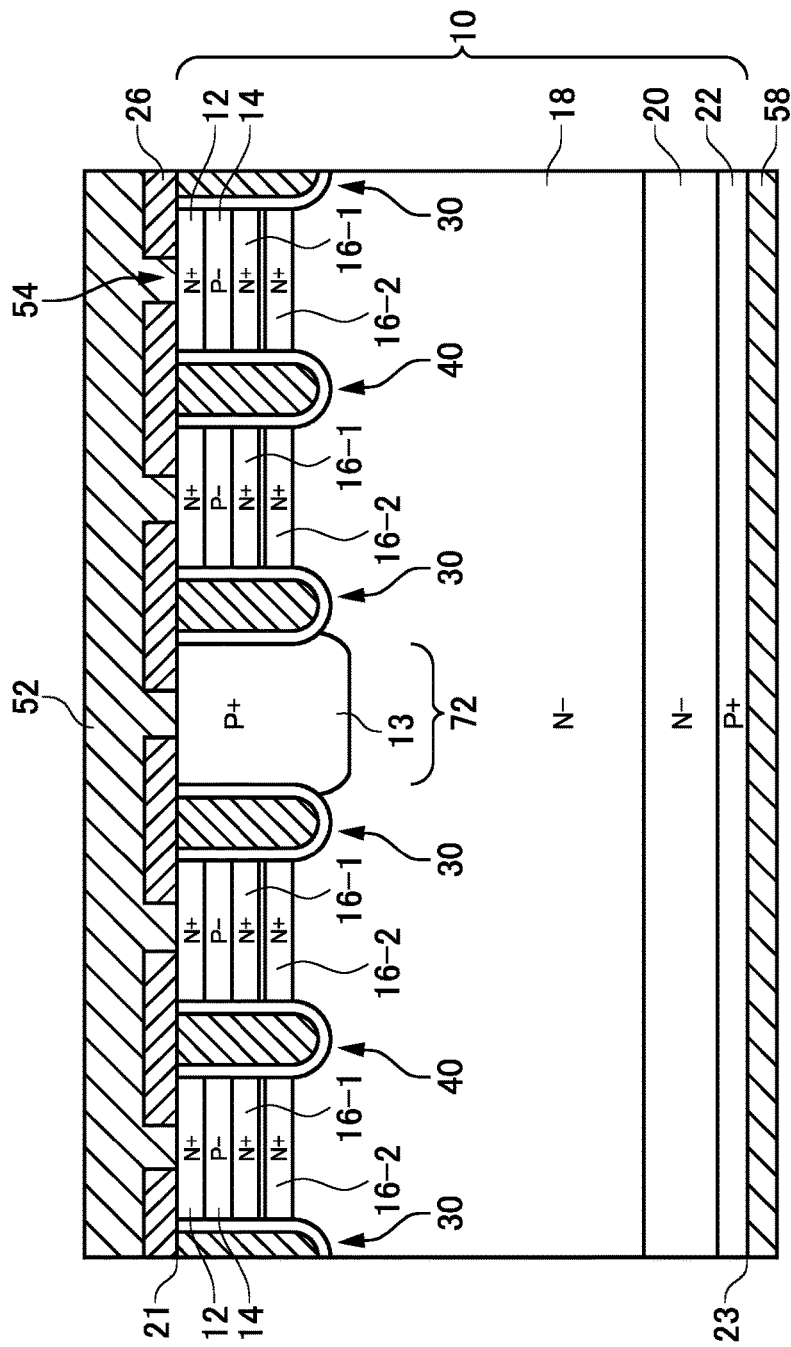
FIG. 9 is a figure showing another example of the cross-section taken along the line a-a in FIG. 3.

FIG. 9 is a figure showing another example of the cross-section taken along the line a-a in FIG. 3. The semiconductor device 100 of the present example has a configuration different from the configuration of the semiconductor device 100 shown in FIG. 4A in terms of the arrangement of accumulation regions 16. In other respects, it has the same configuration as that of the semiconductor device 100 shown in FIG. 4A.

The semiconductor device 100 of the present example has a first accumulation region 16-1 and a second accumulation region 16-2 in each mesa portion 71. The first accumulation region 16-1 is the same as the accumulation region 16 shown in FIG. 4A. The second accumulation region 16-2 is provided below the first accumulation region 16-1 inside the mesa portion 71. The second accumulation region 16-2 may have the doping concentration that is the same as or different from that of the first accumulation region 16-1. The semiconductor device 100 may have accumulation regions 16 that are provided at three or more steps in the depth direction inside the mesa portion 71.

Similar to the first accumulation region 16-1, the second accumulation region 16-2 is provided, in the Y-axis direction, to extend from a region contacting one of adjacent trench portions and to reach a region contacting the other trench portion. The first accumulation region 16-1 and the second accumulation region 16-2 may be provided separate from each other or continuously in the Z-axis direction. With such a structure, the carrier accumulation effect can be further enhanced.

Due to multiple steps of accumulation regions 16 being provided in the depth direction, it becomes easy for electron current that passed a channel formed near the interface of a base region 14 facing a gate trench portion 40 to flow through the vicinity of the center of the mesa portion 71 in the Y-axis direction, at the time of turn-on.

The main constituent of current during the initial period at the time of turn-on is not hole current, but electron current. The "initial period" is a period that begins immediately before gate voltage Vge reaches threshold voltage and ends before a mirror period starts during which Vge becomes constant at the value of about the threshold voltage. If Vge approaches the threshold voltage, a channel begins to open, and injection of electrons into the drift region 18 begins.

Electrons that move downward from the channel might flow temporarily in the array direction in a first accumulation region 16-1 (the Y-axis direction, or the direction from the vicinity of a gate trench portion 40 toward the center of the mesa portion 71). If a second accumulation region 16-2 is not provided, because in the drift region 18 below the first accumulation region 16-1, an electron accumulation layer is already formed in the vicinity of the gate trench portion 40 (threshold voltage for an N-type region at which an electron accumulation layer is formed is much lower than threshold voltage for an inversion layer in a P-type region), the impedance in the vicinity of the gate trench portion 40 is lower than that in the drift region 18. Therefore, electron current mainly flows near the gate trench portion 40.

Once electrons reach the collector region 22 on the rear surface, injection of holes starts in a region extending from the collector region 22 to the buffer region 20 and the drift region 18. Thereby, holes are accumulated near the lower end of a trench portion. As one example, holes are present on the order of $1.0 \times 10^{16}$ [cm$^{-3}$] in a region ranging from the vicinity of the lower end of a gate trench portion 40 to a side portion of a dummy trench portion 30 below a first accumulation region 16.

Holes gather at the lower end of a gate trench portion 40 and the lower end of a dummy trench portion 30. In particular, because a dummy conductive portion 34 is at the same potential as the emitter electrode 52, it is easy for a hole inversion layer to be formed at the side wall of a dummy trench portion 30. Holes injected from the collector region 22 gather at the vicinity of this hole inversion layer. Holes are distributed continuously from a dummy trench portion 30 to the lower end of a gate trench portion 40. Due to this hole distribution, large displacement current flows to the vicinity of the lower end of the gate trench portion 40 at the time of turn-on, in some cases.

The semiconductor device 100 of the present example further includes second accumulation regions 16-2. In this case, the impedance for electron current is lower in the route to directly flow from a first accumulation region 16-1 to a second accumulation region 16-2 than in the route to return from the vicinity of the center of the first accumulation region 16-1 to the vicinity of the gate trench portion 40, and flow to the second accumulation region 16-2.

Among regions below respective accumulation regions, holes tend to accumulate in hole high concentration regions adjacent to gate trench portions 40. Also, due to electron current being flowing not through the vicinity of gate trench portions 40, but through the vicinity of the center of a mesa portion 71, accumulation of holes in the hole high concentration regions is facilitated. Because of this, flow of electron current through the vicinity of the center of the mesa portion 71 is facilitated.

By providing multiple steps of accumulation regions 16 in the depth direction, it becomes easy for electron current to advance downward passing through the vicinity of the center of the mesa portion 71. If electron current flows through the vicinity of the center of the mesa portion 71, the hole distribution near a bottom portion of the mesa portion 71 is divided near the center of the mesa portion 71 by the electron current. Because of this, holes on the dummy trench portion 30 side relative to the route of the electron current do not flow toward the gate trench portion 40 side. This division of the hole distribution at a center portion of the mesa portion 71 suppresses accumulation of holes at the lower end of the gate trench portion 40. Because of this, displacement current can be reduced. Because displacement current can be reduced, charging of the gate conductive portion 44 is reduced, and instantaneous increase in gate voltage Vge can be suppressed. Thereby, the voltage reduction rate (dV/dt) of inter-collector-emitter voltage can be suppressed.

Figure 10:
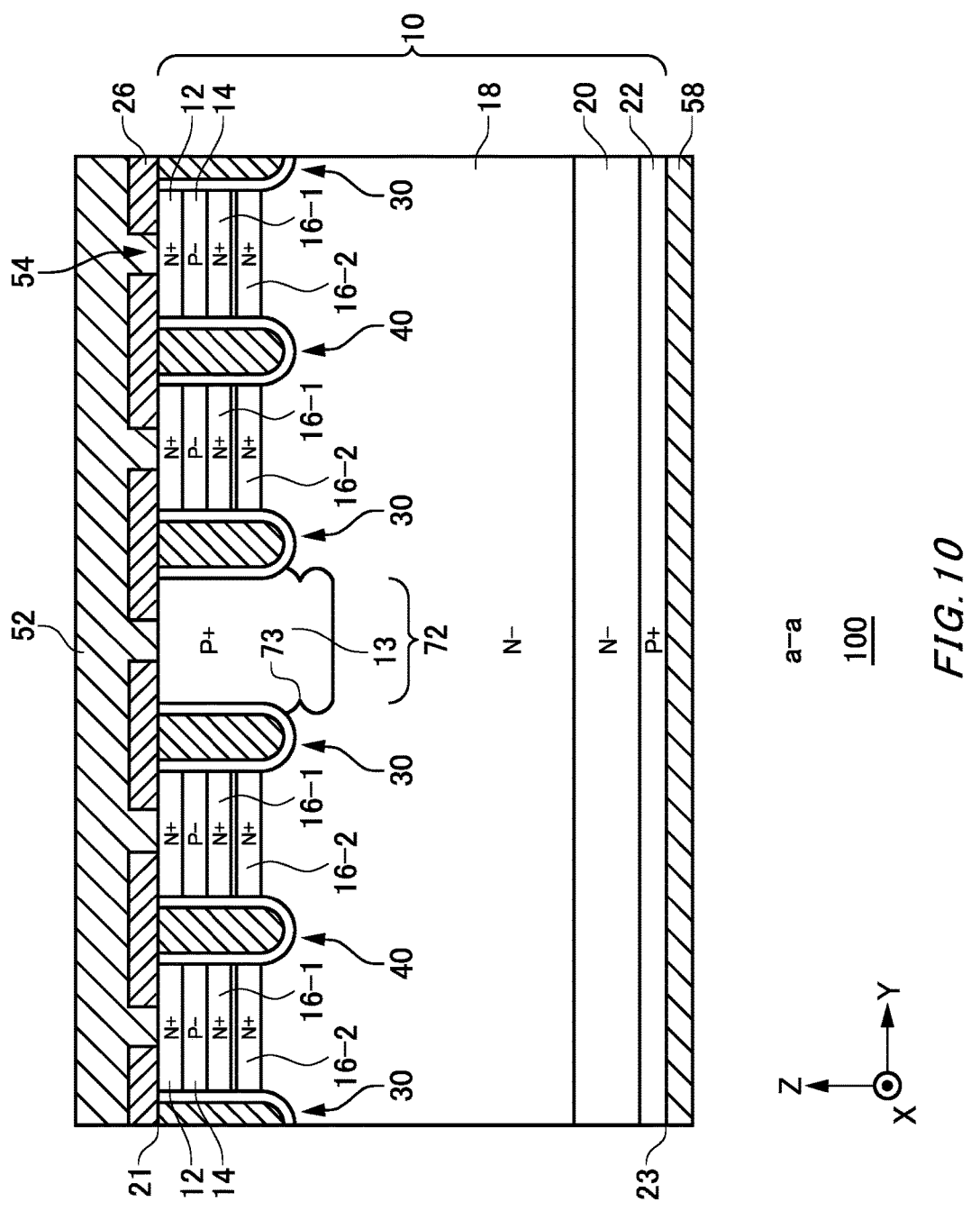

FIG. 10 is a figure showing another example of the cross-section taken along the line a-a in FIG. 3. The semiconductor device 100 of the present example is different from the semiconductor device 100 of any of the aspects explained in FIG. 1 to FIG. 9 in terms of the shape of the first well region 13. In other respects, it has the same configuration as that of the semiconductor device 100 explained in any of FIG. 1 to FIG. 9. FIG. 10 shows an example in which the shape of the first well region 13 is changed in the semiconductor device 100 shown in FIG. 9.

The first well region 13 of the present example has a recessed portion 73 where the width in the Y-axis direction becomes the minimum in the Y-Z plane. Also, the first well region 13 may have a plurality of recessed portions 73 the positions in the Z-axis direction of which are different from each other. At least one recessed portion 73 may be provided lower than the lower ends of dummy trench portions 30. The first well region 13 has peaks of the doping concentration both above and below the recessed portion 73.

The first well region 13 of the present example can be formed by implanting P-type impurities multiple times while changing their implantation depths. By changing the implantation depths of the impurities, the first well region 13 can be formed to reach a deeper position. That is, the first well region 13 having a width in the Y-axis direction which is relatively small and having a depth in the Z-axis direction which is large can be formed easily. Carriers such as holes can be extracted easily by forming the first well region 13 to reach a deep position.

As one example, the first well region 13 may be formed 20% or more deeper or 50% or more deeper than the dummy trench portions 30. Also, the difference in the depths of the first well region 13 and the dummy trench portions 30 may be greater than the width of the dummy mesa portion 72 in the Y-axis direction. The first well region 13 may be formed deeper than the second well region 11.

Figure 11:
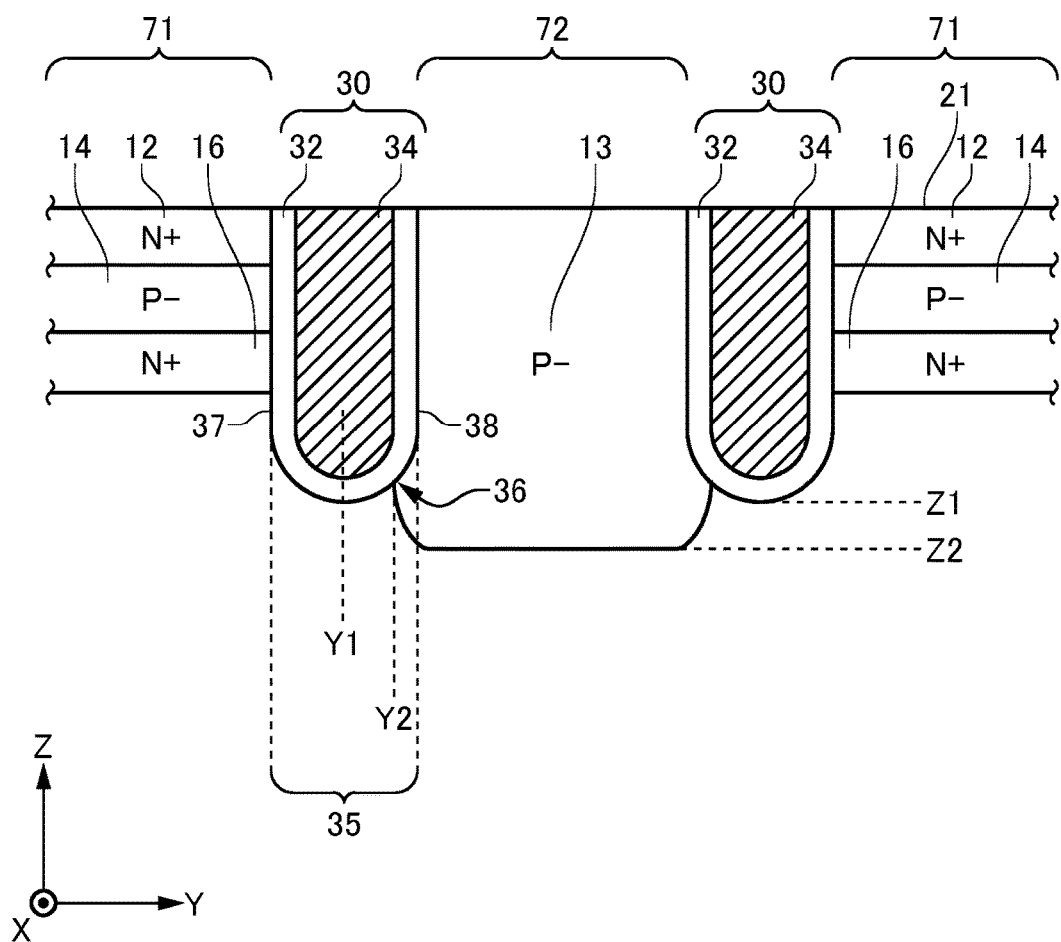
FIG. 11 is a cross-sectional diagram showing an expanded view of a portion near a first well region 13.

FIG. 11 is a cross-sectional diagram showing an expanded view of a portion near the first well region 13. A dummy trench portion 30 of the present example has, in the Y-Z plane, a first dummy side wall 38, a second dummy side wall 37 and a bottom portion 35. The first dummy side wall 38 contacts the first well region 13. The second dummy side wall 37 is a side wall opposite to the first dummy side wall 38 in the Y-Z plane.

The first well region 13 of the present example covers at least part of the bottom portion 35 of the dummy trench portion 30. The bottom portion 35 of the present example has a curved surface shape protruding downward from the lower ends of the first dummy side wall 38 and the second dummy side wall 37. A lower end position Z2 of the first well region 13 is arranged lower than a lower end position Z1 of the dummy trench portion 30.

A region of the side wall of the dummy trench portion 30 having an inclination which is the same as that of a portion contacting the base region 14 may be regarded as the second dummy side wall 37. The first dummy side wall 38 is a side wall that is opposite to the second dummy side wall 37, and extends over the same depth range as the second dummy side wall 37 does. The bottom portion 35 may refer to a region that is less inclined to the upper surface 21 of the semiconductor substrate 10 than the first dummy side wall 38 and the second dummy side wall 37 are. Due to the first well region 13 covering at least part of the bottom portion 35 of the dummy trench portion 30, the carrier extraction speed can further be improved.

The first well region 13 covers at least part of a region that is part of the bottom portion 35 of the dummy trench portion 30 and is between a central position Y1 in the width direction (Y-axis direction) and the first dummy side wall 38. That is, a position Y2 of an end portion 36, in the Y-axis direction, of the first well region 13 covering the bottom portion 35 is arranged between the central position Y1 of the bottom portion 35 and the first dummy side wall 38. With such a structure, the carrier extraction speed can further be improved.

Figure 12:
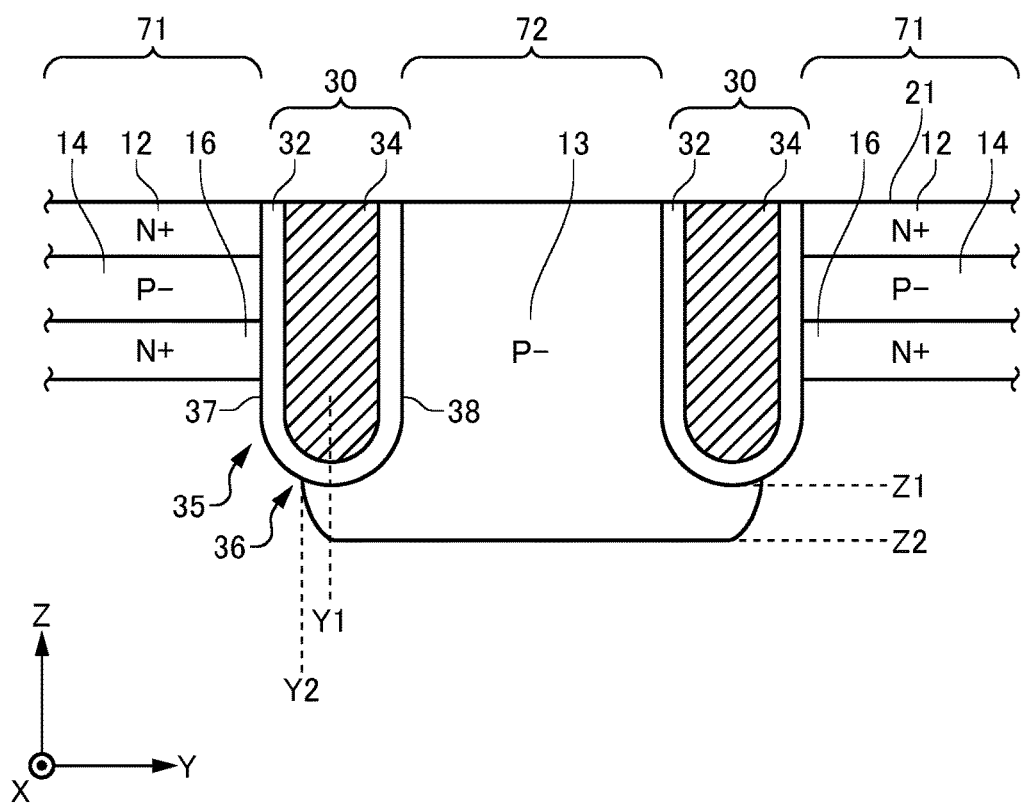
FIG. 12 is a cross-sectional diagram showing an example in which in the structure shown in FIG. 11, the position of an end portion 36 of the first well region 13 covering a bottom portion 35 is changed.

FIG. 12 is a cross-sectional diagram showing an example in which in the structure shown in FIG. 11, the position of the end portion 36 of the first well region 13 covering the bottom portion 35 is changed. The first well region 13 of the present example covers the bottom portion 35 to reach a position on the second dummy side wall 37 side past the central position Y1 of the bottom portion 35. That is, the position Y2 of the end portion 36 of the first well region 13 is arranged between the central position Y1 of the bottom portion 35 and the second dummy side wall 37. With such a structure, the carrier extraction speed can further be improved.

Figure 13:
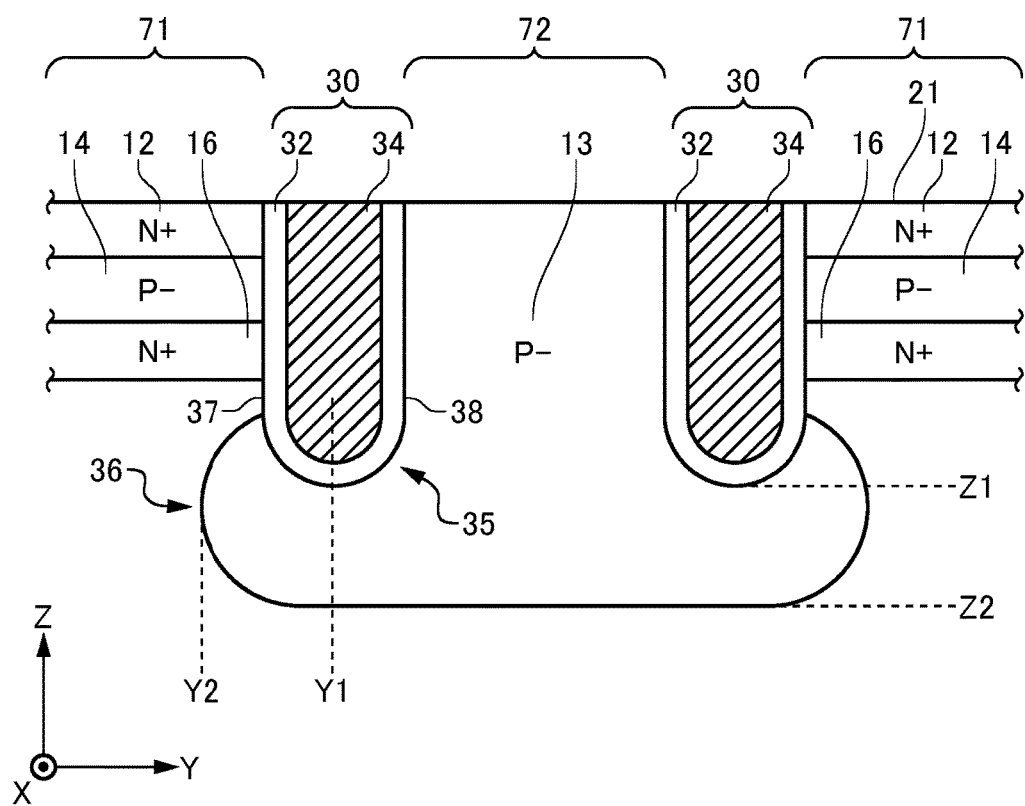
FIG. 13 is a cross-sectional diagram showing an example in which in the structure shown in FIG. 11, the position of the end portion 36 of the first well region 13 covering the bottom portion 35 is changed.

FIG. 13 is a cross-sectional diagram showing an example in which in the structure shown in FIG. 11, the position of the end portion 36 of the first well region 13 covering the bottom portion 35 is changed. The first well region 13 of the present example covers the entire bottom portion 35. That is, the position Y2 of the end portion 36 of the first well region 13 is arranged on the center side of the mesa portion 71 past the second dummy side wall 37. In this case, the first well region 13 is provided to reach a position below the mesa portion 71. With such a structure, the carrier extraction speed can further be improved.

In a trench portion contacting a mesa portion 71, the length from a trench portion side wall on the mesa portion 71 side to Y2 may be shorter or longer than the length from the trench portion side wall to Y1. In the present example, in a trench portion contacting a mesa portion 71, the length from a trench portion side wall on the mesa portion 71 side to Y2 is shorter than length from the trench portion side wall to Y1.

Figure 14:
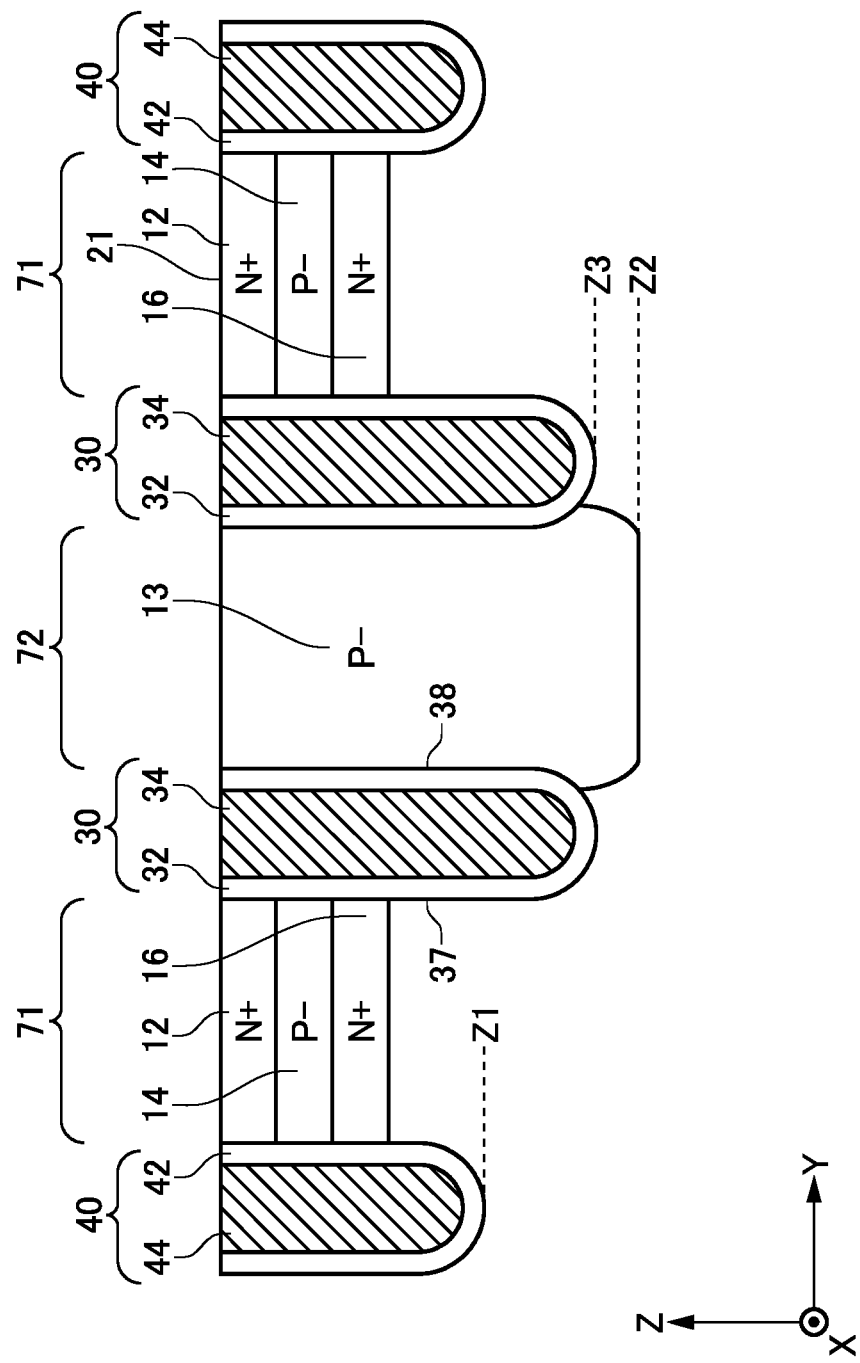
FIG. 14 is a figure showing another example of dummy trench portions 30 and gate trench portions 40.

FIG. 14 is a figure showing another example of dummy trench portions 30 and gate trench portions 40. Dummy trench portions 30 of the present example are formed deeper than the gate trench portions 40 as seen from the upper surface 21 of the semiconductor substrate 10. That is, lower end positions Z3 of the dummy trench portions 30 are arranged lower than the lower end positions Z1 of the gate trench portions 40. As seen from the upper surface 21 of the semiconductor substrate 10, the dummy trench portions 30 may be formed 10% or more deeper or 20% or more deeper than the gate trench portions 40 are. With such a structure, the carrier extraction speed can further be improved.

Figure 15:
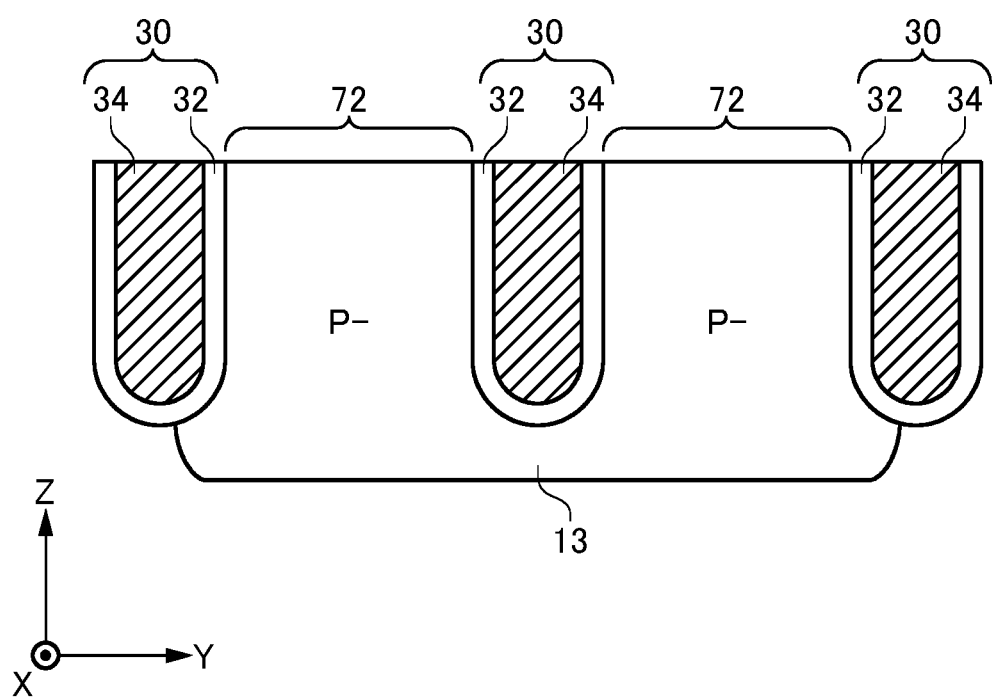
FIG. 15 is a figure showing another example of the first well region 13.

FIG. 15 is a figure showing another example of the first well region 13. In the semiconductor device 100 of the present example, three or more dummy trench portions 30 are arrayed continuously in the Y-axis direction. The three or more dummy trench portions 30 may be sandwiched by gate trench portions 40 in the Y-axis direction. In the present example, the first well regions 13 provided to two or more dummy mesa portions 72 are linked to each other.

In the present example, among a plurality of dummy trench portions 30 arrayed continuously, a dummy trench portion 30 other than dummy trench portions 30 arranged at both ends in the Y-axis direction may be covered by the first well region 13 at its entire bottom portion. The relationship between the dummy trench portions 30 arranged at both ends in the Y-axis direction and the first well region 13 is the same as that in any of the aspects explained in FIG. 1 to FIG. 14. With such a structure, the carrier extraction speed can further be improved.

Figure 16:
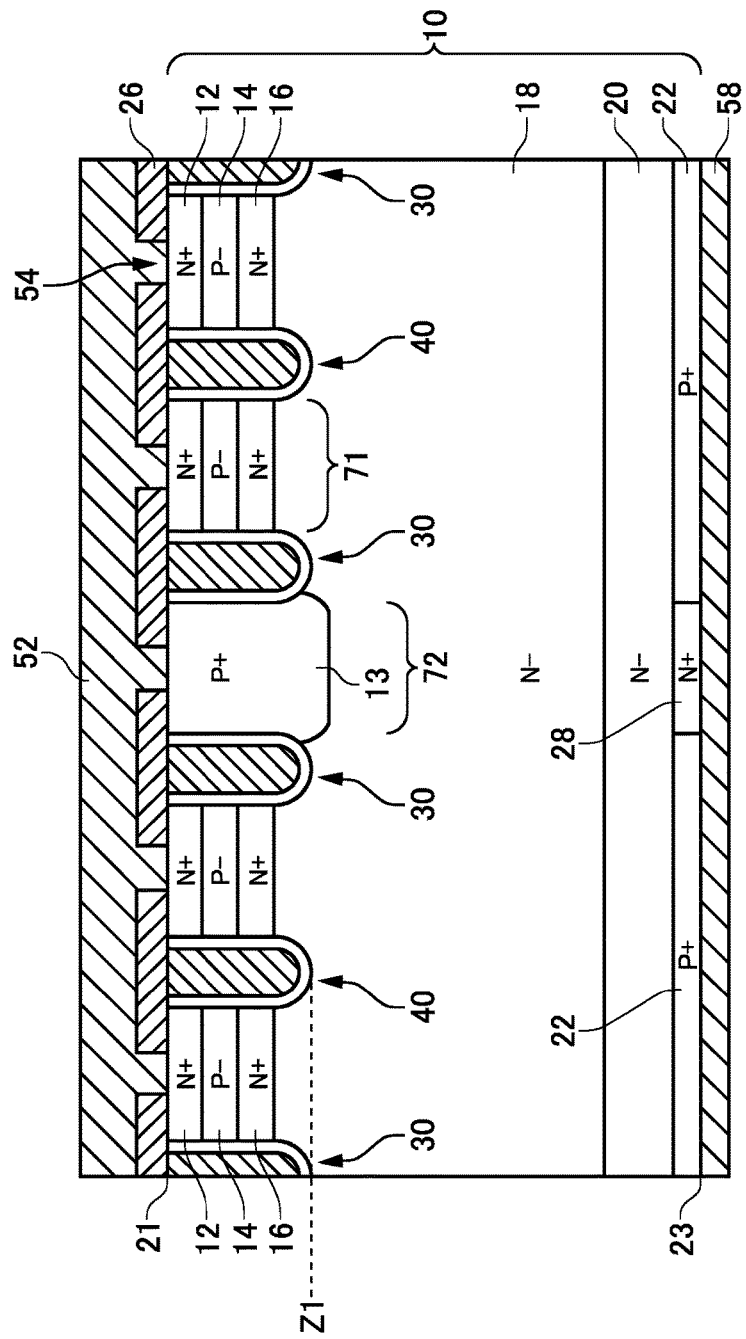
FIG. 16 is a figure showing another example of the cross-section taken along the line a-a of the semiconductor device 100.

FIG. 16 is a figure showing another example of the cross-section taken along the line a-a of the semiconductor device 100. The semiconductor device 100 of the present example is different from the semiconductor device 100 explained in FIG. 1 to FIG. 15 in that it further includes a lower-surface side region 28. In other respects, it has the same configuration as that of the semiconductor device 100 in any of the aspects explained in FIG. 1 to FIG. 15.

The lower-surface side region 28 is provided in at least a partial region below the dummy mesa portion 72 and at the same depth position as the collector region 22. The lower-surface side region 28 is an N-type region. The lower-surface side region 28 may have a doping concentration higher than that of the drift region 18. The lower-surface side region 28 may have a doping concentration higher than that of the buffer region 20.

The lower-surface side region 28 may have a width, in the Y-axis direction, which is the same as that of the dummy mesa portion 72. The lower-surface side region 28 may have a width, in the Y-axis direction, which is smaller than or greater than that of the dummy mesa portion 72. The lower-surface side region 28 may be formed also below dummy trench portions 30, and may be formed also in partial regions below mesa portions 71.

By providing the lower-surface side region 28, second conductivity type carrier accumulation below the dummy mesa portion 72 can be suppressed. Carrier concentration below the dummy mesa portion 72 has small influence on the ON voltage of the semiconductor device 100. Because of this, carrier extraction at the time of turn-off or the like can be made easy while lowering the ON voltage.

Figure 17:
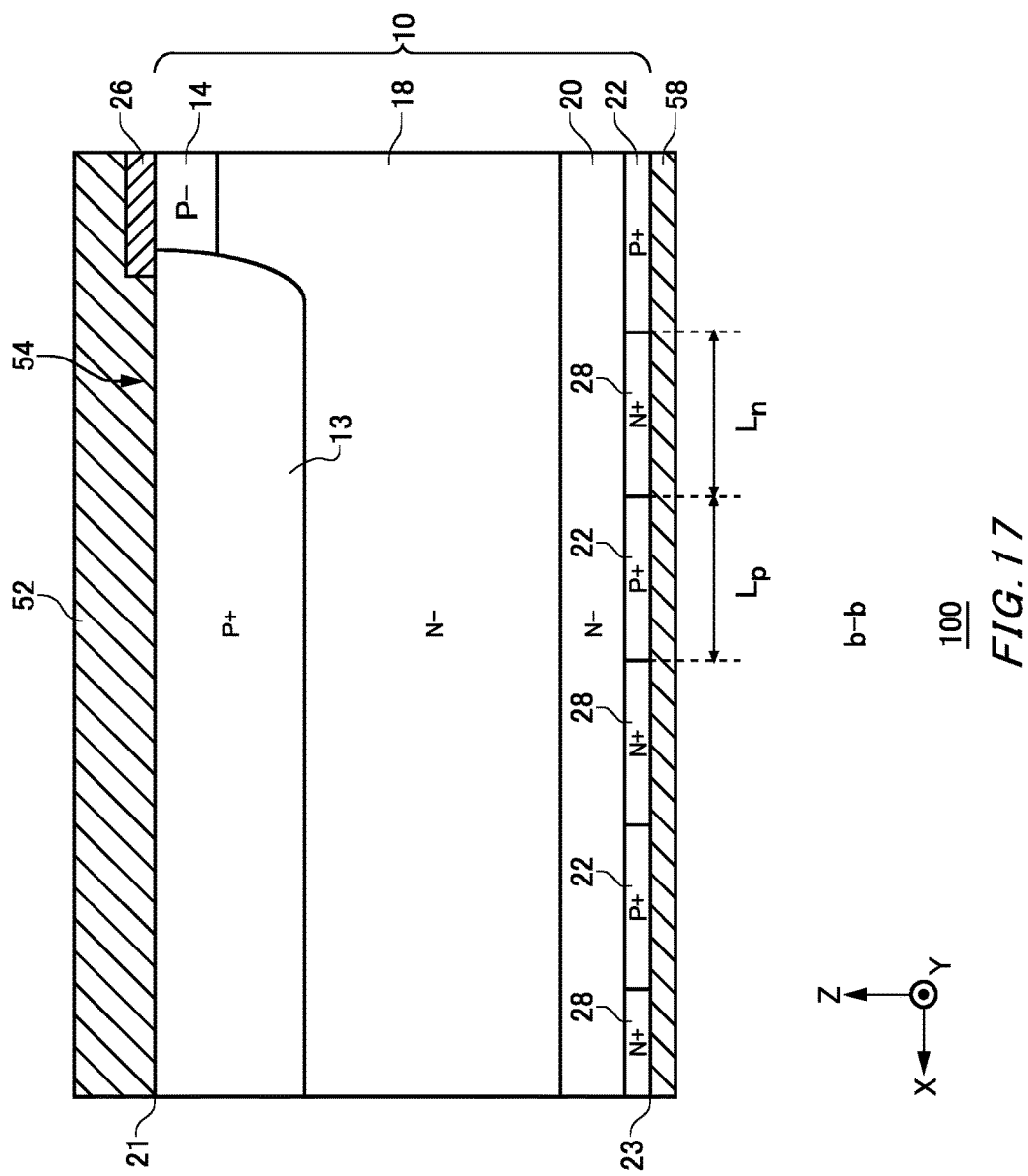
FIG. 17 is a figure showing one example of a cross-section taken along a line B-B shown in FIG. 3.

FIG. 17 is a figure showing one example of a cross-section taken along a line B-B shown in FIG. 3. However, the structure shown in FIG. 17 can be applied also to the semiconductor device 100 shown in figures other than FIG. 3. The cross-section taken along a line B-B is an X-Z plane passing through the contact hole 54 in the dummy mesa portion 72.

In the semiconductor device 100 of the present example, below the dummy mesa portion 72, collector regions 22 and lower-surface side regions 28 are arranged alternately along the longer side direction of the dummy trench portion 30. With such a structure, the area ratio between collector regions 22 and lower-surface side regions 28 can be adjusted easily. In the X-axis direction, the width of one collector region 22 and the width of one lower-surface side region 28 may be the same. In the X-axis direction, the width of one collector region 22 may be greater than the width of one lower-surface side region 28, and the width of one lower-surface side region 28 may be greater than the width of one collector region 22.

Also, the range in the X-axis direction in which the collector regions 22 are provided may at least partially overlap the range in the X-axis direction in which the emitter regions 12 are provided. The range in the X-axis direction in which the collector regions 22 are provided may match the range in the X-axis direction in which the emitter regions 12 are provided. The ranges in the X-axis direction in which the collector regions 22 are provided may be encompassed by the ranges in the X-axis direction in which the emitter regions 12 are provided, and the ranges in the X-axis direction in which the emitter regions 12 are provided may be encompassed by the ranges in the X-axis direction in which the collector regions 22 are provided.

A length $L_p$, in the X-axis direction, of a collector region 22 sandwiched by two lower-surface side regions 28 in the X-axis direction may be longer than or shorter than a length $L_n$ of a lower-surface side region 28. In the present example, they are equal. The length $L_p$ of a collector region 22 in the X-axis direction is typically 10 μm, and may be equal to or longer than 5 μm and equal to or shorter than 15 μm. The length $L_n$ of a lower-surface side region 28 is typically 5 μm, and may be equal to or longer than 5 μm and equal to or shorter than 15 μm.

Figure 18:
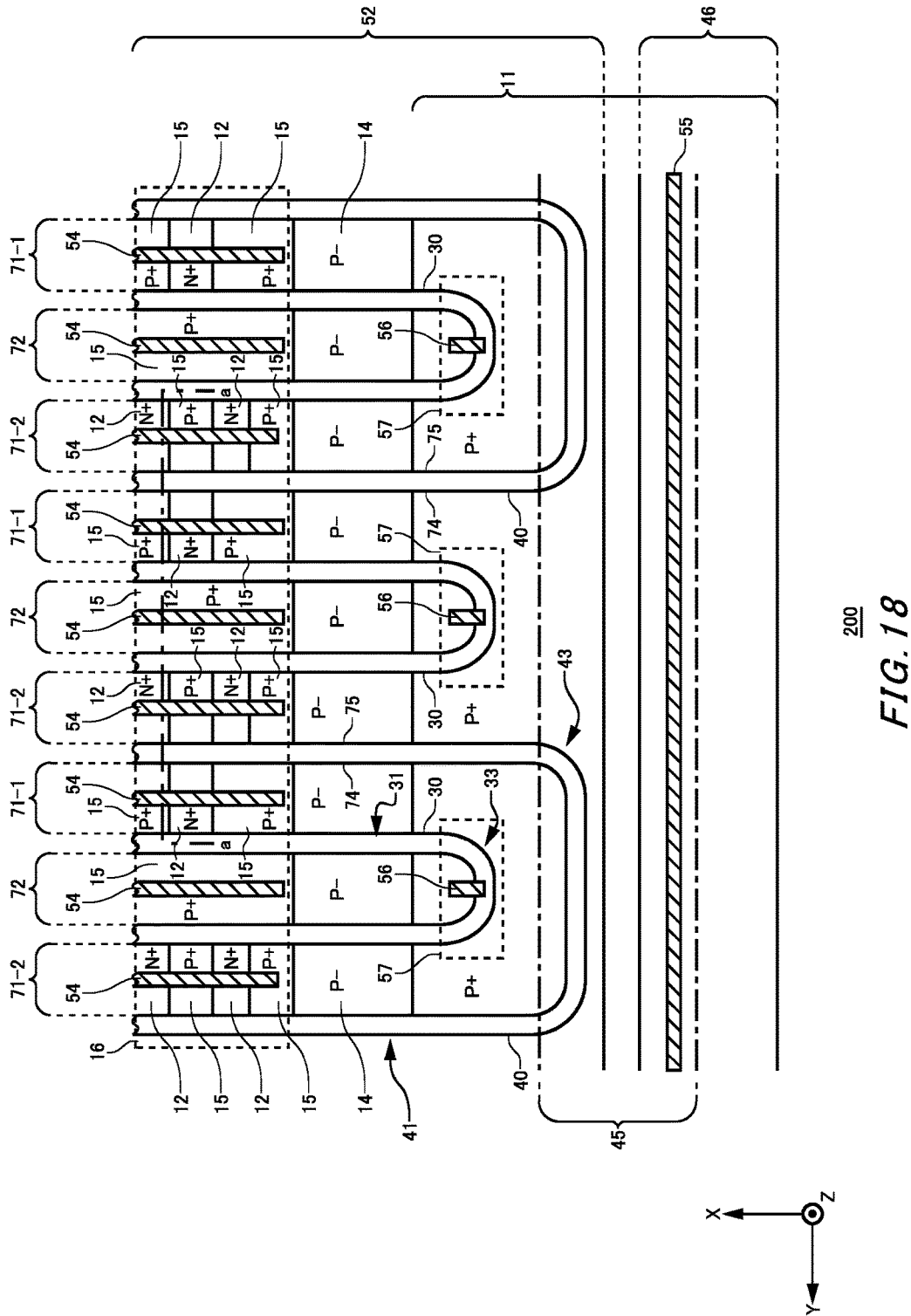
FIG. 18 is a figure showing part of the upper surface of a semiconductor device 200 according to another embodiment of the present invention.

FIG. 18 is a figure showing part of the upper surface of a semiconductor device 200 according to another embodiment of the present invention. The semiconductor device 200 is different from the semiconductor device 100 explained in FIG. 1 to FIG. 17 in terms of the arrangement of emitter regions 12, contact regions 15 and accumulation regions 16. In other respects, it may have the same configuration as that of the semiconductor device 100 explained in any of FIG. 1 to FIG. 17.

In the present example, extending portions 41 of gate trench portions 40 have longer sides and shorter sides at the upper surface of the semiconductor substrate 10. In the example of FIG. 18, the extending portions 41 have longer sides in the X-axis direction, and shorter sides in the Y-axis direction.

A gate trench portion 40 has a first gate side wall 74 along the longer side direction, and a second gate side wall 75 opposite to the first gate side wall 74. The first gate side wall 74 and the second gate side wall 75 are arranged facing each other inside the semiconductor substrate 10.

In the present example, among mesa portions 71, mesa portions 71 adjacent to first gate side walls 74 are regarded as first mesa portions 71-1, and mesa portions 71 adjacent to second gate side walls 75 are regarded as second mesa portions 71-2. That is, one of mesa portions 71 arranged sandwiching a gate trench portion 40 is regarded as a first mesa portion 71-1 and the other mesa portion 71 is regarded as a second mesa portion 71-2.

Emitter regions 12 and contact regions 15 are arranged to be exposed alternately along X-axis direction at the respective upper surfaces of first mesa portions 71-1 and second mesa portions 71-2. In the semiconductor device 100 of the present example, at least a partial region of at least one of the emitter regions 12 in the first mesa portions 71-1 is arranged at a position facing one of the contact regions 15 in the second mesa portions 71-2. That is, the range in the X-axis direction in which at least one emitter region 12 is provided in the first mesa portions 71-1 at least partially overlaps the range in the X-axis direction in which one of the contact regions 15 is provided in the second mesa portions 71-2.

In the example of FIG. 18, all the emitter regions 12 in the first mesa portions 71-1 are entirely arranged at positions facing corresponding ones of the contact regions 15 in the second mesa portions 71-2. The widths, in the X-axis direction, of the emitter regions 12 in a first mesa portion 71-1 may be the same as the widths, in the X-axis direction, of the contact regions 15 in a second mesa portion 71-2.

Also, at least a partial region of at least one of the contact regions 15 in the first mesa portions 71-1 is arranged at a position facing one of the emitter regions 12 in the second mesa portions 71-2. That is, the range in the X-axis direction in which at least one contact region 15 is provided in the first mesa portions 71-1 at least partially overlaps the range in the X-axis direction in which one of emitter regions 12 is provided in the second mesa portions 71-2.

In the example of FIG. 18, all the contact regions 15 in the first mesa portions 71-1 are entirely arranged at positions facing corresponding ones of emitter regions 12 in the second mesa portions 71-2. The widths, in the X-axis direction, of the contact regions 15 in a first mesa portion 71-1 may be the same as the widths, in the X-axis direction, of the emitter regions 12 in a second mesa portion 71-2. However, among the contact regions 15 in the first mesa portions 71-1, contact regions 15 provided to both ends in the X-axis direction are arranged facing both the emitter regions 12 and the contact regions 15 of the second mesa portions 71-2. That is, in both the first mesa portions 71-1 and the second mesa portions 71-2, contact regions 15 are arranged adjacent to base regions 14 provided to both ends in the X-axis direction. Thereby, carriers below the base regions 14 provided to both ends in the X-axis direction can be extracted efficiently. The widths, in the X-axis direction, of the contact regions 15 in a first mesa portion 71-1 may be the same as the sum of the widths, in the X-axis direction, of the emitter regions 12 and the contact regions 15 in a second mesa portion 71-2.

By arranging emitter regions 12 and contact regions 15 while staggering them in the X-axis direction in two mesa portions 71 that are adjacent to each other sandwiching a gate trench portion 40, the contact regions 15 that contribute to extraction of holes can be arranged while being dispersed. Because of this, holes can be extracted evenly in an XY plane, and the withstand capability of the semiconductor device 100 at the time of turn-off can be improved.

In the semiconductor device 200 of the present example, contact regions 15 are exposed to the upper surfaces of dummy mesa portions 72. Base regions 14 may be formed below the contact regions 15. Also, in the semiconductor device 200 of the present example, accumulation regions 16 are formed in mesa portions 71 and dummy mesa portions 72.

Also, in regions which are in first mesa portions 71-1 and second mesa portions 71-2, and where emitter regions 12 or contact regions 15 are formed, a trench portion extending in the shorter side direction (Y-axis direction) of gate trench portions 40 is not formed. That is, in a region where emitter regions 12 and contact regions 15 are orderly arranged, a gate trench portion 40 does not have a branch portion or junction portion extending into a mesa portion 71. Also, the region is also not provided with a dummy trench portion 30. With such a structure, carriers such as holes can be extracted effectively through contact regions 15 arranged while being dispersed, without being inhibited by trench portions.

Figure 19:
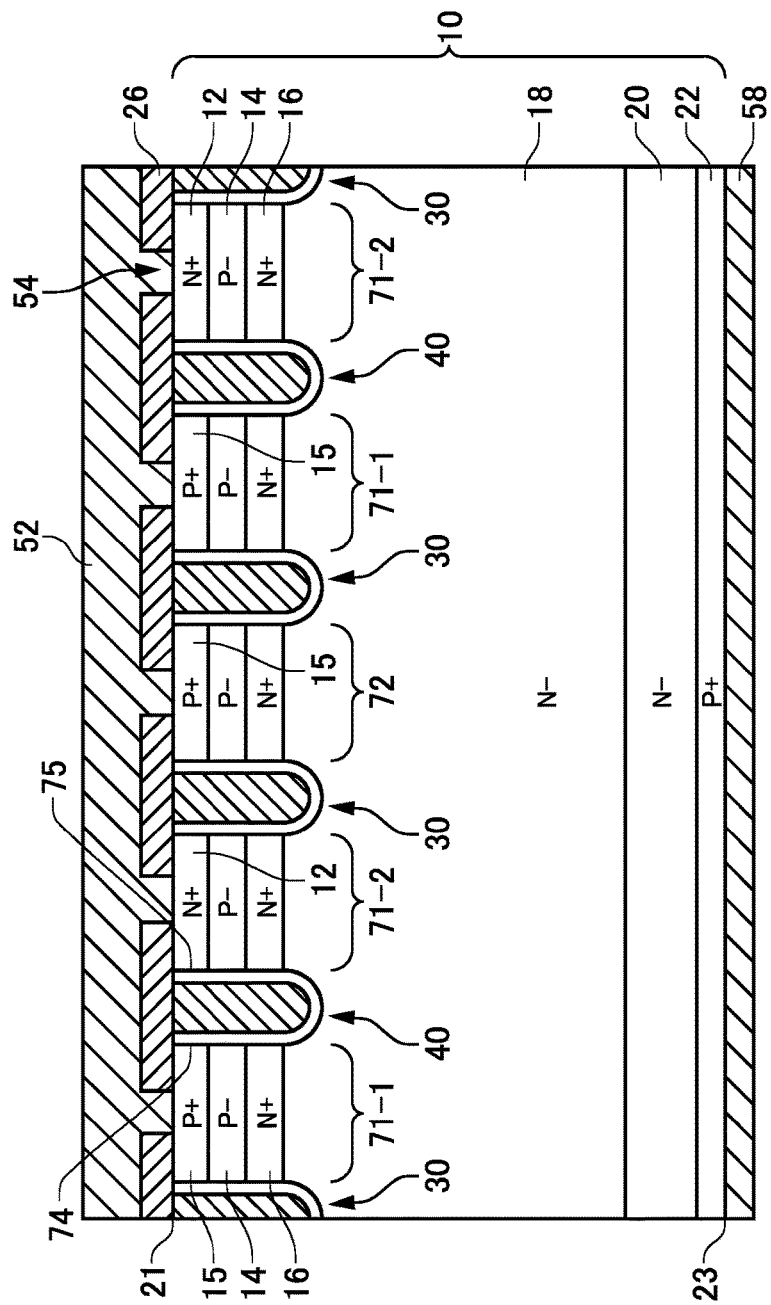
FIG. 19 is a figure showing one example of a cross-section taken along a line a-a in FIG. 18.

FIG. 19 is a figure showing one example of a cross-section taken along a line a-a in FIG. 18. The cross-section taken along the line a-a of the present example is an Y-Z plane passing through contact regions 15 of first mesa portions 71-1 and emitter regions 12 of second mesa portions 71-2.

As mentioned above, the contact regions 15 of the first mesa portions 71-1 and the contact regions 15 of the second mesa portions 71-2 are arranged while being staggered in the X-axis direction. Because of this, in the cross-section shown in FIG. 19, the first mesa portions 71-1 are provided with the contact regions 15 and the second mesa portions 71-2 are provided with the emitter regions 12. With such an arrangement, holes can be extracted evenly.

A dummy mesa portion 72 of the present example is provided with a contact region 15, a base region 14 and an accumulation region 16 in this order from the upper surface 21 side of the semiconductor substrate 10. In another example, the dummy mesa portion 72 may not be provided with an accumulation region 16. Also, similar to the semiconductor device 100 shown in FIG. 1 and FIG. 2A, a mesa portion 71 also may not be provided with an accumulation region 16.

Figure 20:
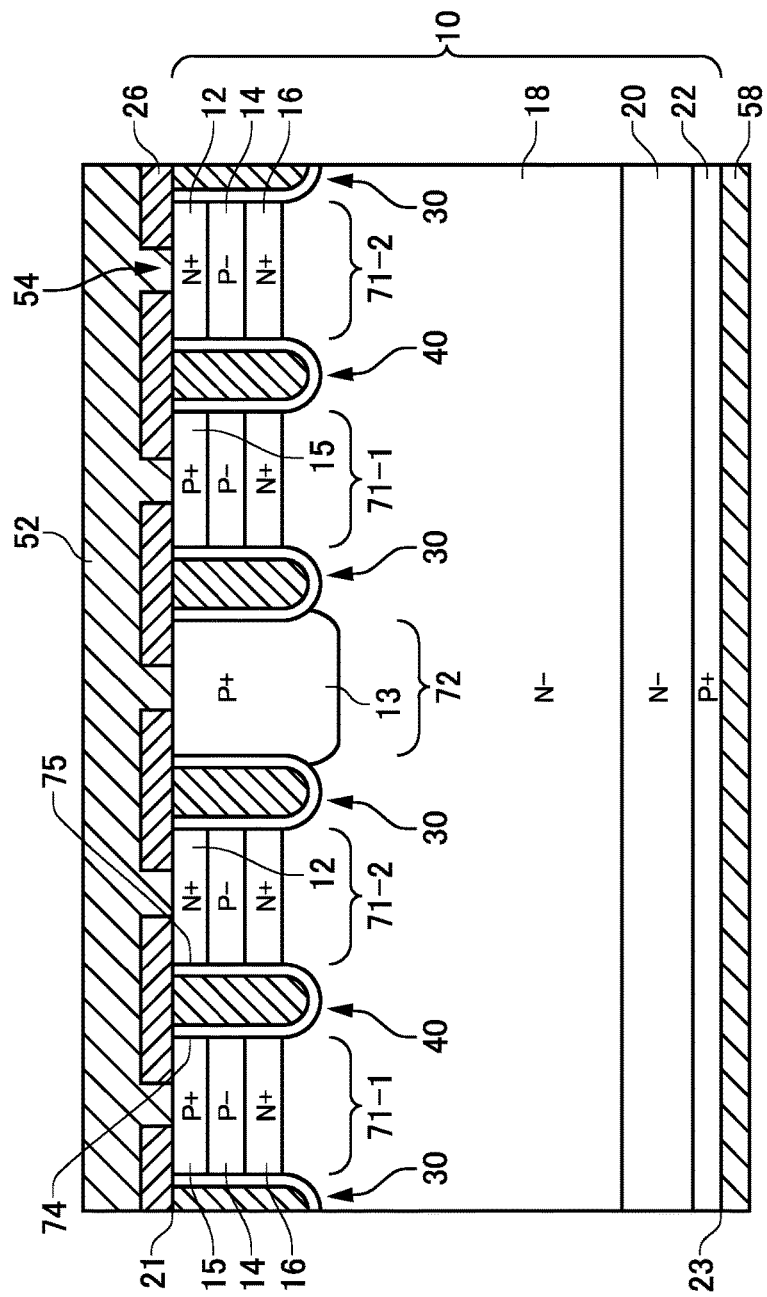
FIG. 20 is a figure showing another example of the cross-section taken along the line a-a in FIG. 18.

FIG. 20 is a figure showing another example of the cross-section taken along the line a-a in FIG. 18. The semiconductor device 200 of the present example is the same as the semiconductor device 100 explained in FIG. 1 to FIG. 17 in terms of the structure of the dummy mesa portions 72. That is, the semiconductor device 200 of the present example has a first well region 13 in a dummy mesa portion 72. With such a structure, carriers can be extracted further easily. Also, the structure of accumulation regions 16 in the semiconductor device 200 may also be the same as the accumulation regions 16 of the semiconductor device 100. Also, the semiconductor device 200 may include the lower-surface side region 28 shown in FIG. 16 and FIG. 17.

Figure 21:
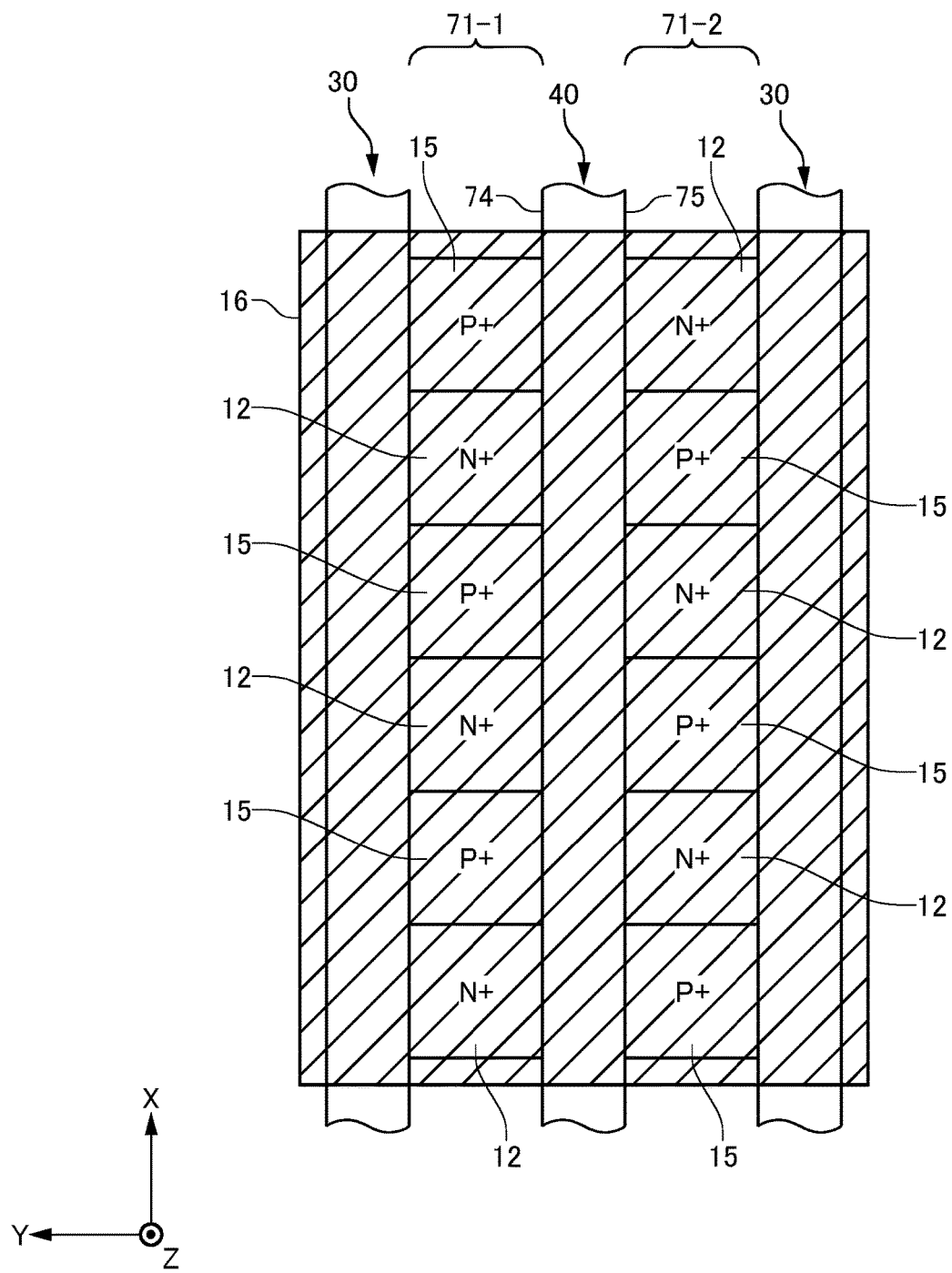
FIG. 21 is a figure showing an arrangement example of emitter regions 12 and contact regions 15 at the upper surfaces of a first mesa portion 71-1 and a second mesa portion 71-2.

FIG. 21 is a figure showing an arrangement example of emitter regions 12 and contact regions 15 at the upper surfaces of a first mesa portion 71-1 and a second mesa portion 71-2. In the present example, emitter regions 12 and contact regions 15 in each mesa portion 71 have the same length in the X-axis direction. Contact regions 15 in the first mesa portion 71-1 are arranged at positions facing emitter regions 12 of the second mesa portion 71-2, and emitter regions 12 in the first mesa portion 71-1 are arranged at positions facing contact regions 15 of the second mesa portion 71-2.

Figure 22:
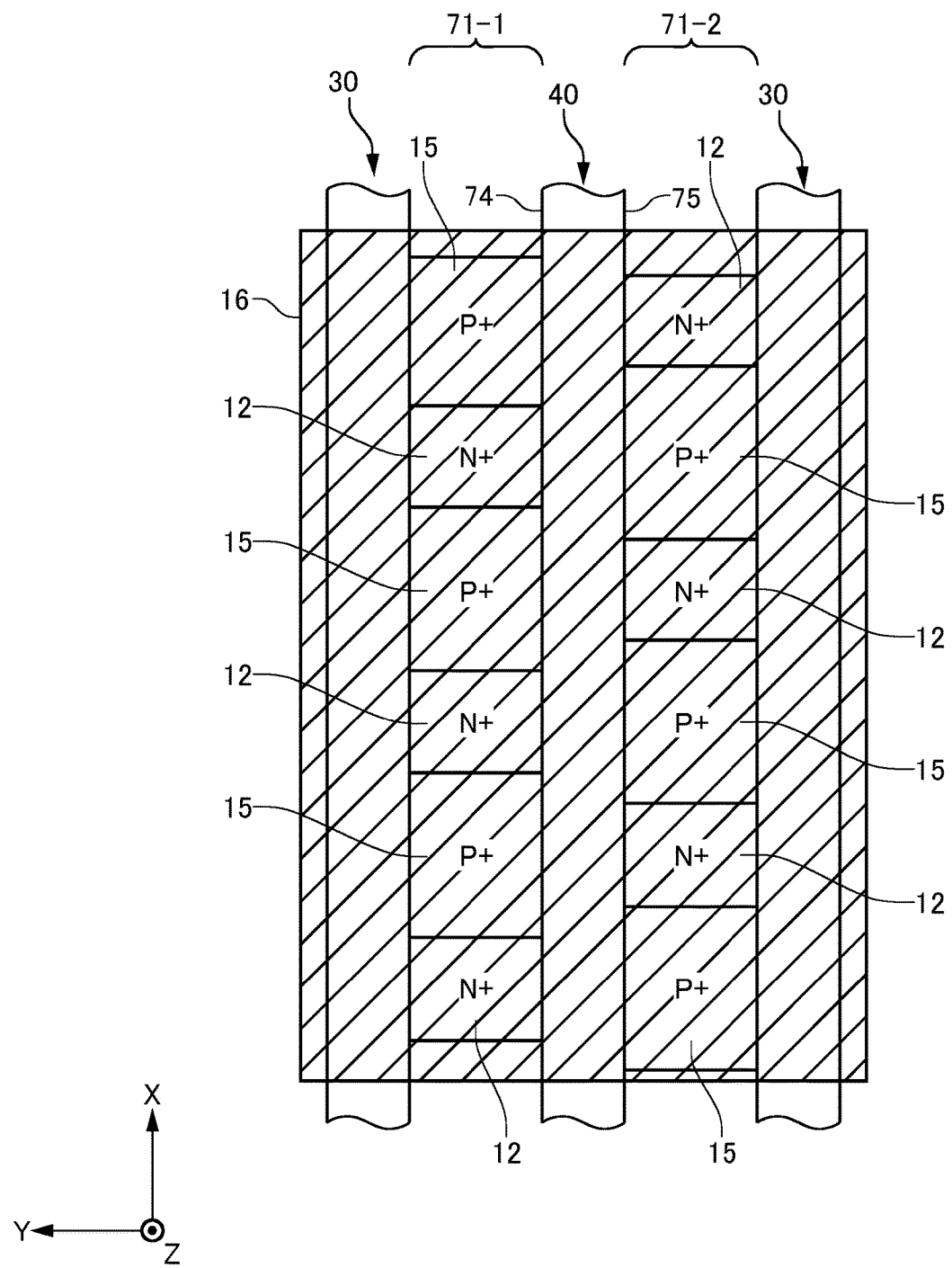
FIG. 22 is a figure showing another arrangement example of emitter regions 12 and contact regions 15 at the upper surfaces of a first mesa portion 71-1 and a second mesa portion 71-2.

FIG. 22 is a figure showing another arrangement example of emitter regions 12 and contact regions 15 at the upper surfaces of the first mesa portion 71-1 and the second mesa portion 71-2. In the present example, in the first mesa portion 71-1 and the second mesa portion 71-2, contact regions 15 are formed longer than emitter regions 12 in the X-axis direction. The length of the contact regions 15 may be twice the length of the emitter regions 12 or longer.

The ranges in the X-axis direction in which the emitter regions 12 are provided in the first mesa portion 71-1 are encompassed by the ranges in the X-axis direction in which the contact regions 15 are provided in the second mesa portion 71-2. The ranges in the X-axis direction in which the emitter regions 12 are provided in the second mesa portion 71-2 are encompassed by the ranges in the X-axis direction in which the contact regions 15 are provided in the first mesa portion 71-1. With such a structure, the carrier extraction speed can be improved.

Figure 23:
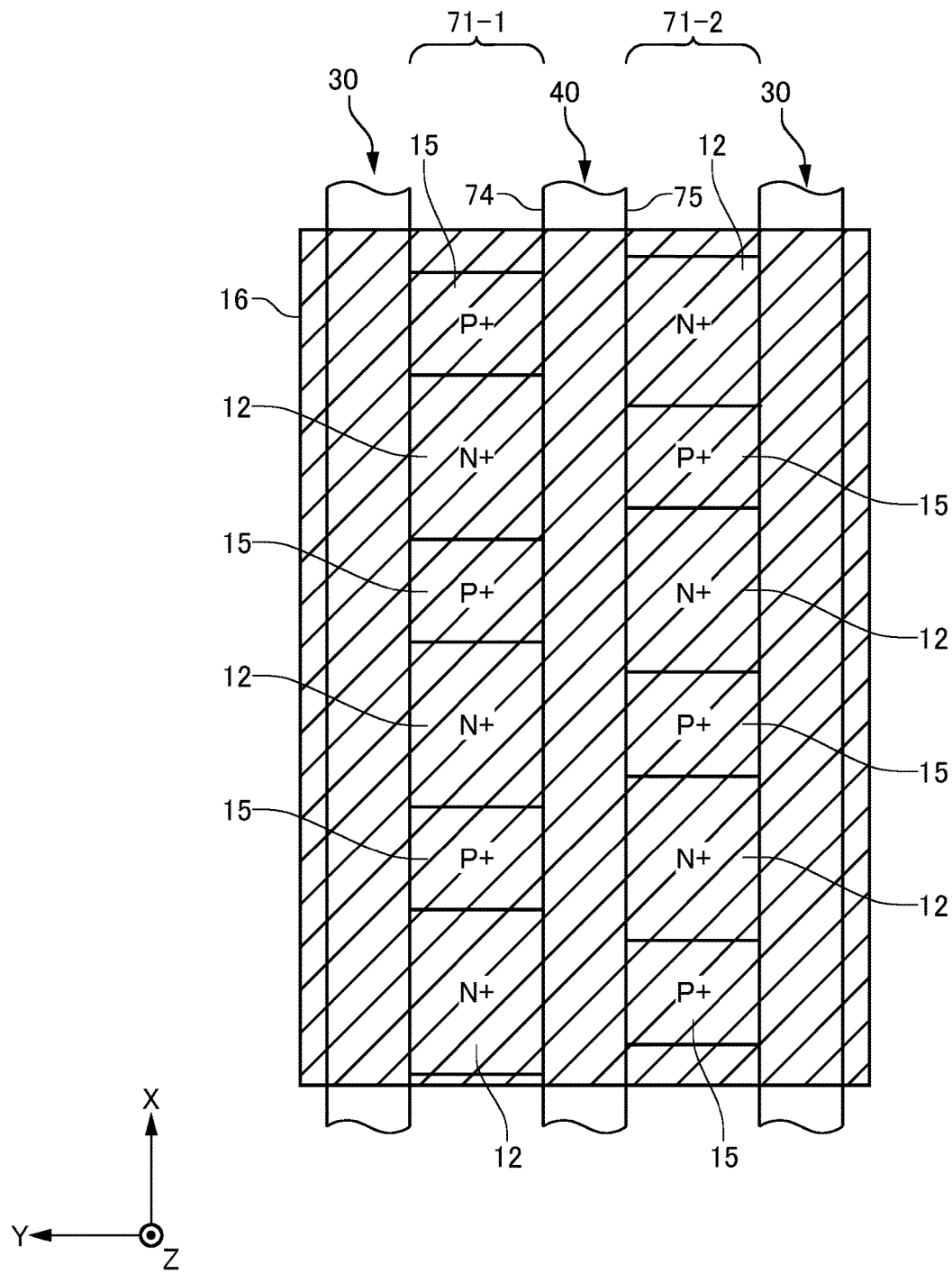
FIG. 23 is a figure showing another arrangement example of emitter regions 12 and contact regions 15 at the upper surfaces of a first mesa portion 71-1 and a second mesa portion 71-2.

FIG. 23 is a figure showing another arrangement example of emitter regions 12 and contact regions 15 at the upper surfaces of a first mesa portion 71-1 and a second mesa portion 71-2. In the present example, in the first mesa portion 71-1 and the second mesa portion 71-2, emitter regions 12 are formed longer than contact regions 15 in the X-axis direction. The length of the emitter regions 12 may be twice the length of the contact regions 15 or longer.

The ranges in the X-axis direction in which the contact regions 15 are provided in the first mesa portion 71-1 are encompassed by the ranges in the X-axis direction in which the emitter regions 12 are provided in the second mesa portion 71-2. The ranges in the X-axis direction in which the contact regions 15 are provided in the second mesa portion 71-2 is encompassed by the ranges in the X-axis direction in which the emitter regions 12 are provided in the first mesa portion 71-1. With such a structure, the channel density can be improved.

Figure 24:
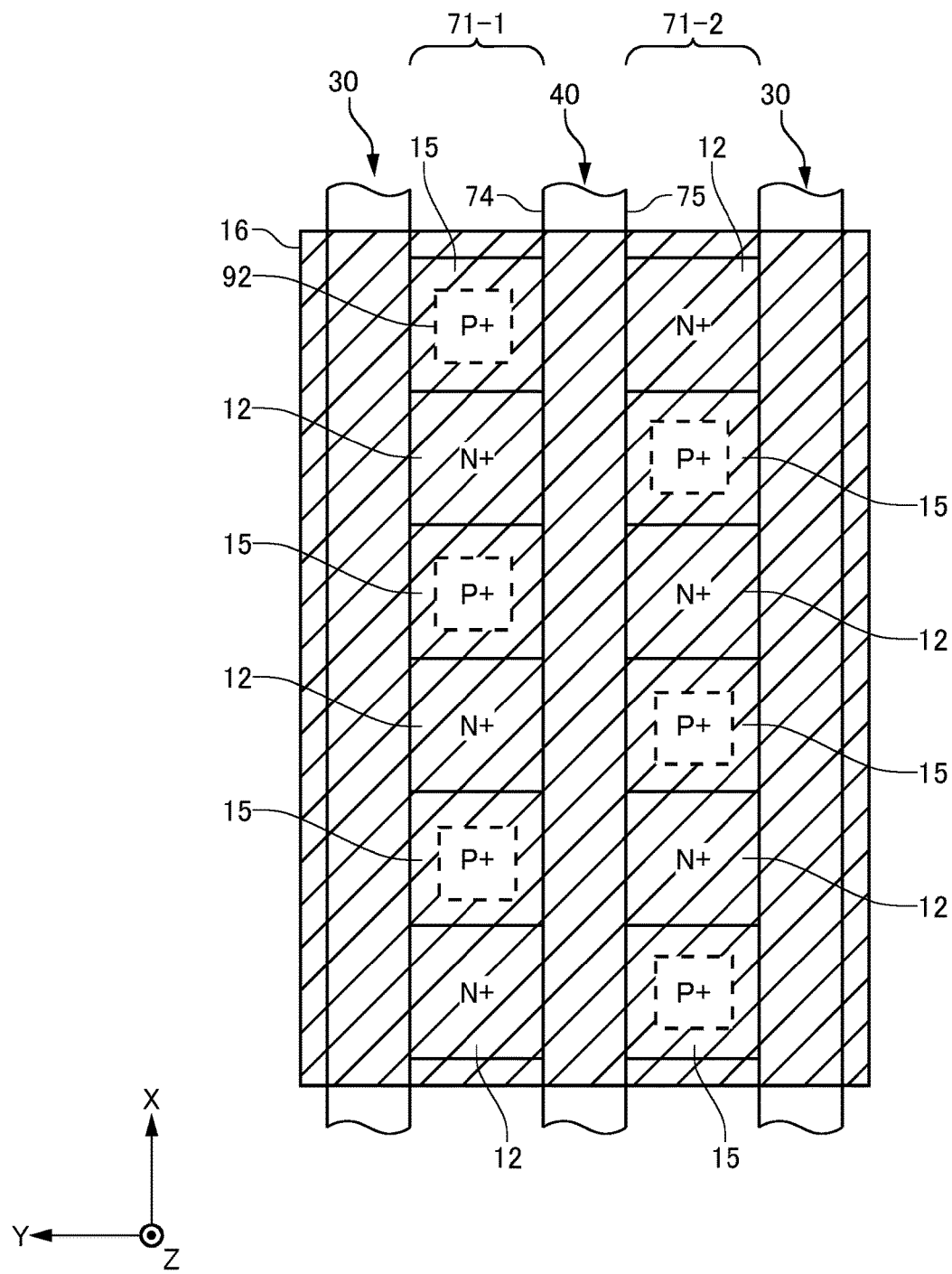
FIG. 24 is a figure showing an arrangement example of an accumulation region 16.

FIG. 24 is a figure showing an arrangement example of an accumulation region 16. The accumulation region 16 of the present example has openings 92 in an XY plane. The drift region 18 may be provided inside the openings 92. The openings 92 may be arranged to overlap contact regions 15 in the first mesa portion 71-1 and the second mesa portion 71-2. With such a structure, carriers can be extracted in the first mesa portion 71-1 and the second mesa portion 71-2. The area of an opening 92 in the XY plane may be the same as or smaller than the area of a contact region 15. The area of the openings 92 may be half the area of the contact regions 15 or smaller.

Figure 25:
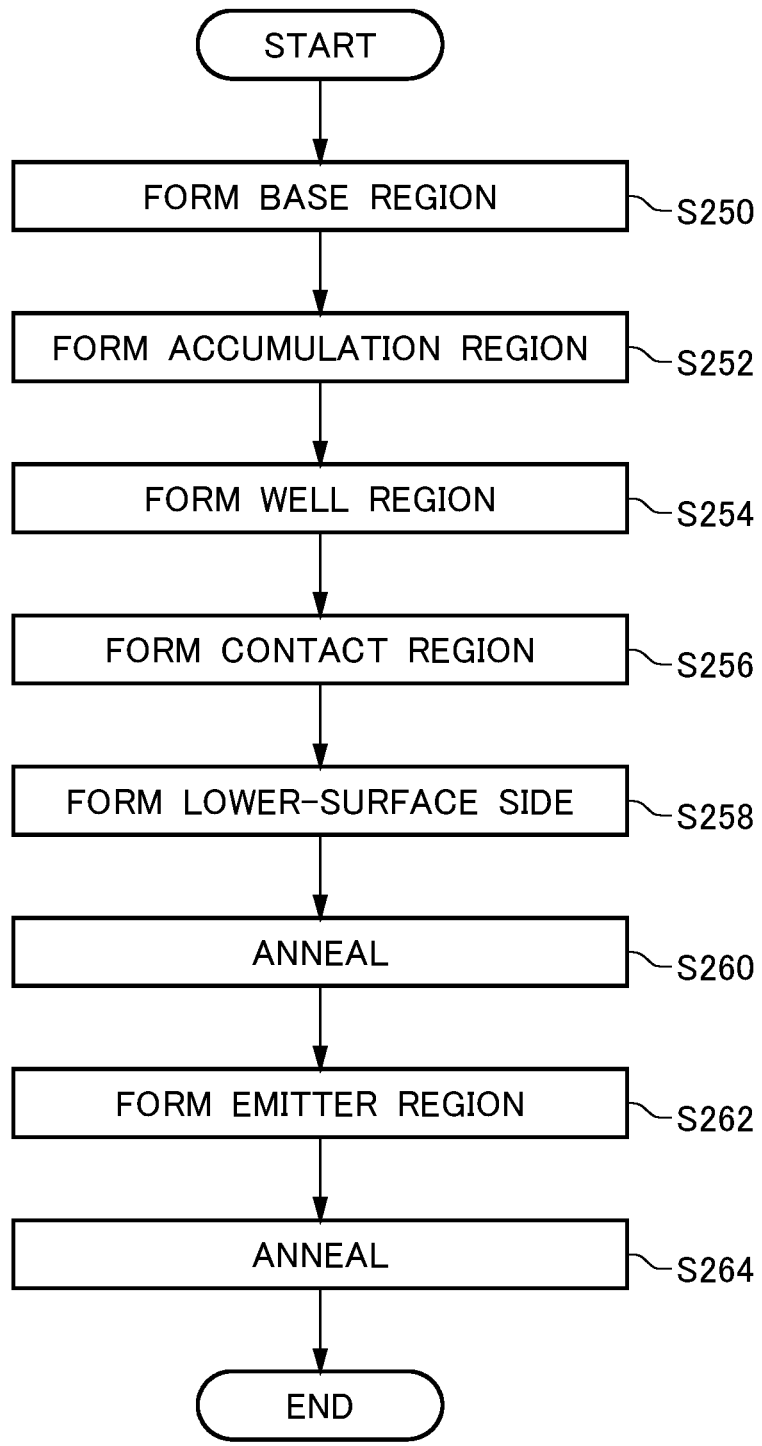
FIG. 25 is a figure showing one example of a method of manufacturing the semiconductor device 100.

FIG. 25 is a figure showing one example of a method of manufacturing the semiconductor device 100. The semiconductor device 200 may be manufactured by a similar method. At Step S250, base regions 14 are formed in the semiconductor substrate 10 provided with gate trench portions 40 and dummy trench portions 30. The base regions 14 may be formed by implanting P-type impurities such as boron from the upper-surface side of the semiconductor substrate 10.

At Step S252, accumulation regions 16 are formed. The accumulation regions 16 may be formed by implanting N-type impurities such as phosphorus from the upper-surface side of the semiconductor substrate 10 using a mask such as a photoresist mask.

At Step S254, first well regions 13 are formed. The first well regions 13 may be formed by implanting P-type impurities such as boron from the upper-surface side of the semiconductor substrate 10 using a mask such as a photoresist mask. The P-type impurities may be implanted to different depths at multiple distinct steps by changing acceleration voltage.

At Step S256, contact regions 15 are formed. The contact regions 15 may be formed by implanting P-type impurities such as boron from the upper-surface side of the semiconductor substrate 10 using a mask such as a photoresist mask.

At Step S258, a structure on the lower-surface side of the semiconductor substrate 10 is formed. For example the collector region 22 is formed.

At Step S260, the semiconductor substrate 10 is annealed under a predetermined condition. Thereby, impurities implanted at Step S250 to S258 are made donors or acceptors, and respective regions are formed.

At Step S262, emitter regions 12 are formed. The emitter regions 12 may be formed by implanting N-type impurities such as arsenic from the upper-surface side of the semiconductor substrate 10 using a mask such as a photoresist mask.

At Step S264, the semiconductor substrate 10 is annealed under a predetermined condition. Thereby, impurities implanted at Step S262 are made donors or acceptors, and the emitter regions 12 are formed.

After Step S264, interlayer dielectric films 26, contact holes 54, an emitter electrode 52 and the like are formed. Thereby, the semiconductor device 100 can be manufactured.

Step S254 may be performed after Step S264. In this case, an annealing step may be included after Step S254. In this case, because the number of times of annealing after the first well regions 13 are formed can be reduced, the depths of the first well regions 13 can be controlled precisely.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The execution order of respective processes in methods shown in the claims, specification, or diagrams can be realized in any order as long as the order is not indicated by "prior to," "before," or the like and as long as the output from a previous process is not used in a later process. Even if the process flow is described using phrases such as "first" or "next" in the claims, specification, or diagrams, it does not necessarily mean that the process must be performed in this order.

What is claimed is:

1. A semiconductor device comprising:
   a semiconductor substrate;
   a first conductivity type drift region provided inside the semiconductor substrate;
   a plurality of gate trench portions provided to extend from an upper surface of the semiconductor substrate and to reach the drift region;
   a dummy trench portion provided between two gate trench portions and provided to extend from the upper surface of the semiconductor substrate and to reach the drift region;
   a second conductivity type base region that is provided in a region of the semiconductor substrate adjacent to any of the gate trench portions; and between the upper surface of the semiconductor substrate and the drift region; and
   a second conductivity type first well region that
   is provided in a region of the semiconductor substrate adjacent to the dummy trench portion; and to reach a position deeper than a lower end of the dummy trench portion; and
   has a doping concentration higher than that of the base region.

2. The semiconductor device according to claim 1, wherein
   two or more dummy trench portions are provided between the two gate trench portions,
   inside the semiconductor substrate, a dummy mesa portion is formed between the two dummy trench portions, and
   the dummy mesa portion is provided with the first well region.

3. The semiconductor device according to claim 2, wherein the first well region is provided in contact with both of the two dummy trench portions.

4. The semiconductor device according to claim 2, further comprising:
   a second conductivity type collector region provided between a lower surface of the semiconductor substrate and the drift region; and
   a first conductivity type lower-surface side region provided in at least a partial region below the dummy mesa portion and at the same depth position as the collector region.

5. The semiconductor device according to claim 4, wherein
   the dummy trench portion has a longer side and a shorter side at the upper surface of the semiconductor substrate, and
   below the dummy mesa portion, the collector regions and the lower-surface side regions are arranged alternately along a longer side direction of the dummy trench portion.

6. The semiconductor device according to claim 2, wherein
   in a region that is inside the semiconductor substrate and is adjacent to the gate trench portions, an accumulation region having a doping concentration higher than that of the drift region is provided, and a first conductivity type doping concentration of a region that is inside the semiconductor substrate, is adjacent to the dummy trench portion, and is at the same depth position as the accumulation region is lower than that of the accumulation region.

7. The semiconductor device according to claim 6, wherein in a mesa portion sandwiched by one of the gate trench portions and the dummy trench portion that are adjacent to each other, the accumulation region is provided in contact with the gate trench portion and not in contact with the dummy trench portion.

8. The semiconductor device according to claim 2, wherein in a mesa portion sandwiched by two trench portions at least one of which is one of the gate trench portions, an accumulation region having a doping concentration higher than that of the drift region is provided to extend from a position contacting one of the trench portions and to reach a position contacting the other of the trench portions, and the dummy mesa portion is not provided with the accumulation region.

9. The semiconductor device according to claim 2, wherein the dummy mesa portion is provided with an accumulation region having a doping concentration higher than that of the drift region.

10. The semiconductor device according to claim 1, wherein the first well region covers at least part of a bottom portion of the dummy trench portion.

11. The semiconductor device according to claim 10, wherein the dummy trench portion has a first dummy side wall to which the first well region is adjacent, and at a bottom portion of the dummy trench portion, the first well region covers at least part of a region between a center of the bottom portion in a width direction and the first dummy side wall.

12. The semiconductor device according to claim 11, wherein the dummy trench portion has a second dummy side wall opposite to the first dummy side wall, and the first well region covers a bottom portion of the dummy trench portion to reach the second dummy side wall side past a center of the bottom portion of the dummy trench portion in the width direction.

13. The semiconductor device according to claim 1, wherein the dummy trench portion and the gate trench portions are formed to reach the same depth.

14. The semiconductor device according to claim 1, wherein the dummy trench portion is formed deeper than the gate trench portions.

15. The semiconductor device according to claim 1, wherein the gate trench portions have longer sides and shorter sides at the upper surface of the semiconductor substrate, the gate trench portions have first gate side walls that are inside the semiconductor substrate and are along a longer side direction of the gate trench portions, and second gate side walls opposite to the first gate side walls, inside the semiconductor substrate, first mesa portions adjacent to the first gate side walls of the gate trench portions and second mesa portions adjacent to the second gate side walls of the gate trench portions are provided, first conductivity type emitter regions and second conductivity type contact regions are arranged at upper surfaces of the first mesa portions and the second mesa portions such that they are exposed alternately along the longer side direction of the gate trench portions, and at least a partial region of at least one of the emitter regions in the first mesa portions is arranged at a position facing one of the contact regions in the second mesa portions.

16. The semiconductor device according to claim 1, further comprising a first conductivity type emitter region provided to an upper surface of the semiconductor substrate adjacent to the gate trench portion, wherein a contact width of a contact formed on the first well region is greater than a contact width of a contact formed on the emitter region.

17. The semiconductor device according to claim 1, wherein a mesa width of a mesa portion between the dummy trench portions is greater than a mesa width of a mesa portion sandwiched by two trench portions at least one of which is one of the gate trench portions.

18. The semiconductor device according to claim 1, wherein a film thickness of a dummy insulating film of the dummy trench portion is greater than a film thickness of gate insulating films of the gate trench portions.

19. A semiconductor device comprising:

a semiconductor substrate;

a gate trench portion that is provided to extend from an upper surface of the semiconductor substrate into the semiconductor substrate; has a longer side and a shorter side on the upper surface of the semiconductor substrate; and has a first gate side wall that is inside the semiconductor substrate and is along a longer side direction and a second gate side wall opposite to the first gate side wall; and a first mesa portion that is inside the semiconductor substrate and is adjacent to the first gate side wall of the gate trench portion, and a second mesa portion that is inside the semiconductor substrate and is adjacent to the second gate side wall of the gate trench portion, wherein first conductivity type emitter regions and second conductivity type contact regions are arranged at respective upper surfaces of the first mesa portion and the second mesa portion such that they are exposed alternately along the longer side direction of the gate trench portion, and at least a partial region of at least one of the emitter regions in the first mesa portions is arranged at a position facing one of the contact regions in the second mesa portions.

20. The semiconductor device according to claim 19, wherein at least a partial region of at least one of the contact regions in the first mesa portions is arranged at a position facing one of the emitter regions in the second mesa portions.

21. The semiconductor device according to claim 19, wherein in the first mesa portion, the emitter regions are formed longer in the longer side direction of the gate trench portion than the contact regions are.

22. The semiconductor device according to claim 19, wherein in the first mesa portion, the contact regions are formed longer in the longer side direction of the gate trench portion than the emitter regions are.

23. The semiconductor device according to claim 19, wherein in the first mesa portion the emitter regions and the contact regions have the same length in the longer side direction of the gate trench portion.

24. The semiconductor device according to claim 19, wherein in the first mesa portion, a trench portion extending in the shorter side direction of the gate trench portion is not formed in a region where the emitter regions or the contact regions are formed.

* * * * *